(12) United States Patent
Welser et al.

(10) Patent No.: US 7,345,327 B2
(45) Date of Patent: Mar. 18, 2008

(54) BIPOLAR TRANSISTOR

(75) Inventors: Roger E. Welser, Providence, RI (US);
Paul M. DeLuca, Providence, RI (US);
Charles R. Lutz, Seekonk, MA (US);
Kevin S. Stevens, Providence, RI (US);
Noren Pan, Wilmette, IL (US)

(73) Assignee: Kopin Corporation, Taunton, MA (US)

( * ) Notice: Subject to any disclaimer, the term of this patent is extended or adjusted under 35 U.S.C. 154(b) by 60 days.

(21) Appl. No.: 10/969,804

(22) Filed: Oct. 20, 2004

(65) Prior Publication Data

US 2005/0139863 A1  Jun. 30, 2005

Related U.S. Application Data

(63) Continuation-in-part of application No. 10/121,444, filed on Apr. 10, 2002, now Pat. No. 6,847,060, which is a continuation-in-part of application No. 09/995,079, filed on Nov. 27, 2001, now Pat. No. 6,750,480.

(60) Provisional application No. 60/371,648, filed on Apr. 10, 2002, provisional application No. 60/370,758, filed on Apr. 5, 2002, provisional application No. 60/253,159, filed on Nov. 27, 2000.

(51) Int. Cl.
*H01L 29/73* (2006.01)

(52) U.S. Cl. ............... 257/200; 257/197; 257/201; 257/E29.188; 257/E29.189

(58) Field of Classification Search ........... 257/197, 257/200, 201, E29.188, E29.189
See application file for complete search history.

(56) References Cited

U.S. PATENT DOCUMENTS 4,518,979 A   5/1985   Dumke et al.

| 5,371,389 A | 12/1994 | Matsuno et al. |
| 5,429,957 A | 7/1995 | Matsuno et al. |
| 5,571,732 A | 11/1996 | Liu |
| 5,606,185 A | 2/1997 | Nguyen et al. |

(Continued)

FOREIGN PATENT DOCUMENTS

| FR | 2 795 871 A1 | 1/2001 |
| JP | 11312685 | 11/1999 |
| WO | WO 01/03194 A1 | 1/2001 |
| WO | WO 02/43155 A2 | 5/2002 |

OTHER PUBLICATIONS

"InGaP/InGaAsN/GaAs NPN double heterojunction bipolar transistor", pp. 2262-2264 Feb. 2000, Chang et al.*

(Continued)

*Primary Examiner*—Evan Pert
*Assistant Examiner*—Victor A. Mandala, Jr.
(74) *Attorney, Agent, or Firm*—Hamilton, Brook, Smith & Reynolds, P.C.

(57) ABSTRACT

A semiconductor material which has a high carbon dopant concentration includes gallium, indium, arsenic and nitrogen. The disclosed semiconductor materials have a low sheet resistivity because of the high carbon dopant concentrations obtained. The material can be the base layer of gallium arsenide-based heterojunction bipolar transistors and can be lattice-matched to gallium arsenide emitter and/or collector layers by controlling concentrations of indium and nitrogen in the base layer. The base layer can have a graded band gap that is formed by changing the flow rates during deposition of III and V additive elements employed to reduce band gap relative to different III-V elements that represent the bulk of the layer. The flow rates of the III and V additive elements maintain an essentially constant doping-mobility product value during deposition and can be regulated to obtain pre-selected base-emitter voltages at junctions within a resulting transistor.

16 Claims, 25 Drawing Sheets

U.S. PATENT DOCUMENTS

| | | | | |
|---|---|---|---|---|
| 5,814,843 | A | * | 9/1998 | Ohkubo ............... 257/197 |
| 5,858,818 | A | | 1/1999 | Ro et al. |
| 5,903,018 | A | | 5/1999 | Shimawaki |
| 6,031,256 | A | | 2/2000 | Liu et al. |
| 6,150,667 | A | * | 11/2000 | Ishizaka et al. ............ 257/21 |
| 6,150,677 | A | | 11/2000 | Tanaka et al. |
| 6,285,044 | B1 | | 9/2001 | Bhat |
| 6,696,711 | B2 | * | 2/2004 | Mochizuki et al. ......... 257/197 |
| 6,750,480 | B2 | | 6/2004 | Welser et al. |
| 6,765,242 | B1 | | 7/2004 | Chang et al. |
| 6,847,060 | B2 | | 1/2005 | Welser et al. |
| 2001/0040244 | A1 | | 11/2001 | Fitzgerald et al. |
| 2002/0027232 | A1 | | 3/2002 | Shigematsu et al. |
| 2002/0102847 | A1 | * | 8/2002 | Sharps et al. ............... 438/681 |
| 2005/0020033 | A1 | | 1/2005 | Specht et al. |
| 2005/0064672 | A1 | | 3/2005 | Welser et al. |
| 2005/0158942 | A1 | | 7/2005 | Welser et al. |
| 2006/0081963 | A1 | | 4/2006 | Rehder et al. |

OTHER PUBLICATIONS

"High Speed InGaP/GaAs HBT's with a strained InGaAs base" pp. 226-228, May 1996, Ahmari et al.*

"Determination of band gap narrowing and hole density for heavily C-doped GaAs by photoluminescence spectroscopy" pp. 88-90, Jan. 1994, Lu et al.*

Chang, et al., "InGaAsN/AlGaAs P-n-p heterojunction bipolar transistor," *Applied Physics Letters*, 79(19):2788-2790 (2000).

Welser, et al., "Low $V_{be}$ GaInAsN Base Heterojunction Bipolar Transistors," *IEICE Trans. Electron.*, E84-C(10): 1389-1393 (2001).

Li, et al., "DC characteristics of MOVPE-grown Npn InGaP/InGaAsN DHBTs," *Electronics Letters*, 36(1): 81-83 (2000).

Kohama, et al., "Using Carbon Tetrachloride for Carbon Doping $Al_xGa_{1-x}As$ Grown by Metalorganic Chemical Vapor Deposition," *Jpn. J. Appl. Phys.*, 34(7A): 3504-3505 (1995).

Sugiura, et al., "Characterization of heavily carbon-doped InGaAsP layers grown by chemical beam epitaxy using tetrabromide," *Applied Physics Letters*, 73(12):2482-2484 (1998).

Bhat, et al., "Growth of GaAsN/GaAs, GaInAsN/GaAs and GaInAsN/GaAs quantum wells by low-pressure organometallic chemical vapor deposition," *Journal of Crystal Growth*, 195: 427-437 (1998).

Welser, R.E., et al., "Role of Neutral Base Recombination in High Gain AlGaAs/GaAs HBT's," *IEEE Transactions on Electron Devices*, 46(8):1599-1607(1999).

Chang, P.C., et al., "InGaP/InGaAsN/GaAs NpN double-heterojunction bipolar transistor," *Appl. Phys. Lett.*, 76(16):2262-2264(2000).

Ahmari, D.A., et al., "High-speed InGaP/GaAs HBT's with a Strained $In_xGa_{1-x}As$ Base," *IEEE Electron Device Letters*,17(5):226-228(1996).

Welser, R.E., et al., "Turn-on Voltage Investigation of GaAs-Based Bipolar Transistors with $Ga_{1-x}In_xAs_{1-y}N_y$ Base Layers," *IEEE Electron Device Letters*, 21(12):1-4(2000).

Low, T., et al., "InGaP HBT technology for RF and microwave instrumentation," *Solid-State Electronics*, 43:1437-1444(1999).

Liu, W., et al., "Current Transport Mechanism in GaInP/GaAs Heterojunction Bipolar Transistors," *IEEE Transactions on Electron Devices*, 40(8):1378-1383(1993).

Lu, Z.H., et al., "Determination of band gap narrowing and hole density for heavily C-doped GaAs by photoluminescence," *Appl. Phys. Lett.*, 64(1): 88-90(1994).

Welser, R.E., et al., "High Performance $Al_{0.35}Ga_{0.65}As$/GaAs HBT's," *IEEE Electron Device Letters*, 21(5):196-199(2000).

Welser, R.E., et al., "Base Current Investigation of the Long-Term Reliability of GaAs-Based HBTs," *GaAs Mantech*, (2000).

Patton, G.L., et al. "Graded-SiGe-Base, Poly-Emitter Heterojunction Bipolar Transistors," *IEEE Electron Device Letters*, 10(12):534-536(1989).

Ida, M., et al., "InP/InGaAs DHBTs with 341-Ghz $f_T$ at high current density of over 800 $kA/cm^2$," *IEEE*, (2001).

Kroemer, H., "Heterostructure bipolar transistors: What should we build?" *J. Vac. Sci. Technol.*, B1(2):126-130(1983).

Fujihara, A., et al., "High-speed InP/InGaAs DHBTs with Ballistic Collector Launcher Structure," *IEEE*, (2001).

Nakahara, K., et al., "Continuous-wave operation of long-wavelength GaInNAs/GaAs quantum well laser," *Electronic Letters*, 32(17): 1585-1586(1996).

Mochizuki, K., et al., "GaInP/GaAs Collector-Up Tunneling-Collector Heterojunction Bipolar Transistors (C-Up TC-HBTs): Optimization of Fabrication Process and Epitaxial Layer Structure for High-Efficiency High-Power Amplifiers," *Transactions on Electron Devices*, 47(12):2277-2283(2000).

Pan N., et al., "Pseudomorphic In-Graded Carbon Doped GaAs Base Heterojunction Bipolar Transistors by Metal Organic Chemical Vapor Deposition," *Journal of Electronic Materials*, 25(7):13 (1996).

Ohkubo, M., et al., "Compositionally Graded C-doped $In_{1-x}Ga_xAs$ Base in InP/InGaAs D-HBTs Grown by MOCVD with Low Base Sheet Resistance and High Current Gain", *IEEE*, pp. 641-644, 1997.

Stockman, S. A., et al., "Carbon Doping of $In_xGa_{1-x}As$ By MOCVD Using $CCl_4$", pp. 40-43, no date given.

Keiper, D., et al., "Metalorganic Vapour Phase Epitaxy Growth of InP-based Heterojunction Bipolar Transistors with Carbon Doped InGaAs Base Using Tertiarybutylarsine and Tertiarybutylphosphine in $N_2$ Ambient", XP-001030248, *Jpn. J. Appl. Phys.*, vol. 39:6162-6165 (2000).

Stillman, G. E., et al., "Carbon-doped InGaAs grown by MOCVD for InP/InGaAs heterojunction bipolar transistors", *Inst. Phys. Conf. Ser. No. 129*:687-692 (1992).

Kroemer, H., "Two Integral Relations Pertaining to the Electron Transport Through a Bipolar Transistor With a Nonuniform Energy Gap in the Base Region," *Solid-State Electronic*, 28(11):1101-1103 (1985).

Maziar, C. M., et al., "On the Estimation of Base Transit Time in AlGaAs/GaAs Bipolar Transistors," *IEEE Electron Device Lett.* 8:90-91 (1987).

Stockman, S. A., et al., "Growth of carbon-doped p-type $In_xGa1-xAs$ ($0<x \leq 0.53$) by metalorganic chemical vapor deposition," *Appl. Phys. Lett* 60(23):2903-2905 (1992).

* cited by examiner

| 500 Å Si-doped In$_{0.6}$Ga$_{0.4}$As (1×10$^{19}$ cm$^{-3}$) |
|---|
| 500 Å Si-doped InGaAs Grade (1×10$^{19}$ cm$^{-3}$) |
| 1500 Å Si-doped GaAs (5×10$^{18}$ cm$^{-3}$) |
| 500 Å Si-doped InGaP (4×10$^{17}$ cm$^{-3}$) |
| 500-1800 Å C-doped Ga$_{1-x}$In$_x$As$_{1-y}$N$_y$ (1.5-4.5×10$^{19}$ cm$^{-3}$) x≈3y |
| 7500 Å Si-doped GaAs (1×10$^{16}$ cm$^{-3}$) |
| 5000 Å Si-doped GaAs (5×10$^{18}$ cm$^{-3}$) |
| GaAs SUBSTRATE |

FIG. 1

| 500 Å Si-doped In$_{0.6}$Ga$_{0.4}$As (1×10$^{19}$ cm$^{-3}$) |
|---|
| 500 Å Si-doped InGaAs Grade (1×10$^{19}$ cm$^{-3}$) |
| 1500 Å Si-doped GaAs (5×10$^{18}$ cm$^{-3}$) |
| 500 Å Si-doped InGaP (4×10$^{17}$ cm$^{-3}$) |
| 50 Å transitional layer |
| 500 Å C-doped Ga$_{1-x}$In$_x$As$_{1-y}$N$_y$ (1.5-4.5×10$^{19}$ cm$^{-3}$) <br> x ≈ 3y compositional grade |
| 50 Å transitional layer |
| ~200 Å Si-doped InGaP |
| 4000 Å Si-doped GaAs (1×10$^{16}$ cm$^{-3}$) |
| 5000 Å Si-doped GaAs (5×10$^{18}$ cm$^{-3}$) |
| GaAs SUBSTRATE |

FIG. 7A

| |
|---|
| 500 Å Si-doped $In_{0.6}Ga_{0.4}As$ ($1 \times 10^{19}$ cm$^{-3}$) |
| 500 Å Si-doped InGaAs Grade ($1 \times 10^{19}$ cm$^{-3}$) |
| 1500 Å Si-doped GaAs ($5 \times 10^{18}$ cm$^{-3}$) |
| 500 Å Si-doped InGaP ($4 \times 10^{17}$ cm$^{-3}$) |
| 50 Å transitional layer |
| 350 Å C-doped graded $Ga_{1-x}In_xAs_{1-y}N_y$ ($3 - 7 \times 10^{19}$ cm$^{-3}$) <br> $\Delta E_g$ compositional grade ~ 100 meV, average $E_g$ ~ 1.34 eV (80 meV lower than GaAs) |
| 50 Å transitional layer |
| 2500 Å Si-doped GaAs ($1 \times 10^{16}$ cm$^{-3}$) |
| 5000 Å Si-doped GaAs ($5 \times 10^{18}$ cm$^{-3}$) |
| GaAs SUBSTRATE |

High speed structure for $f_t$ ($f_{max}$) ~ 160 GHz.
Bold = critical layers

FIG. 7B

| |
|---|
| 500 Å Si-doped In$_{0.6}$Ga$_{0.4}$As (1 × 10$^{19}$ cm$^{-3}$) |
| 500 Å Si-doped InGaAs Grade (1 × 10$^{19}$ cm$^{-3}$) |
| 1500 Å Si-doped GaAs (5 × 10$^{18}$ cm$^{-3}$) |
| 500 Å Si-doped InGaP (4 × 10$^{17}$ cm$^{-3}$) |
| 50 Å transitional layer |
| 700 Å C-doped Ga$_{1-x}$In$_x$As$_{1-y}$N$_y$ (4 × 10$^{19}$ cm$^{-3}$) <br> ΔE$_g$ compositional grade ~ 60 meV, average E$_g$ ~ 1.24 eV (180 meV lower than GaAs) |
| 50 Å transitional layer |
| 7000 ~ 12000 Å Si-doped GaAs (1 × 10$^{16}$ cm$^{-3}$) |
| 5000 Å Si-doped GaAs (5 × 10$^{18}$ cm$^{-3}$) |
| GaAs SUBSTRATE |

PA structure version 1 - no tunnel collector.
Bold = critical layers

FIG. 7C

Graded GaInAsN DHBT Epilayer Structure

| Layer | Material | Thickness(Å) | Doping(cm$^{-3}$) |
|---|---|---|---|
| cap layer | Ga$_{0.5}$In$_{0.5}$As | 500 | n> 1x10$^{19}$ |
| cap layer (graded) | Ga$_x$In$_{1-x}$As x=0 to 0.5 | 500 | n> 1x10$^{19}$ |
| emitter 1 | GaAs | 1000 | n 5x10$^{18}$ |
| emitter 2 | Ga$_{0.5}$In$_{0.5}$P | 300 | n 3x10$^{17}$ |
| base | Ga$_{(1-x)}$In$_x$As$_{(1-y)}$N$_y$ | T$_b$ | p 4x10$^{19}$ |
| collector | GaAs | 4000 | n 3x10$^{16}$ |
| subcollector | GaAs | 7000 | n 5x10$^{18}$ |

Constant Composition GaInAsN DHBT Epilayer Structure

| Layer | Material | Thickness (Å) | Doping (cm$^{-3}$) |
|---|---|---|---|
| cap layer | $Ga_{0.5}In_{0.5}As$ | 500 | $n > 1 \times 10^{19}$ |
| cap layer (graded) | $Ga_xIn_{1-x}As$ x=0 to 0.5 | 500 | $n > 1 \times 10^{19}$ |
| emitter 1 | GaAs | 1000 | $n\ 5 \times 10^{18}$ |
| emitter 2 | $Ga_{0.5}In_{0.5}P$ | 300 | $n\ 3 \times 10^{17}$ |
| base | $Ga_{(1-x)}In_xAs_{(1-y)}N_y$ | $T_b$ | $p\ 4 \times 10^{19}$ |
| collector | GaAs | 4000 | $n\ 3 \times 10^{16}$ |
| subcollector | GaAs | 7000 | $n\ 5 \times 10^{18}$ |

| Layer | Material | Thickness (Å) | Doping (cm$^{-3}$) |
|---|---|---|---|
| Contact layer | $Ga_{0.5}In_{0.5}As$ | 500 | n> 1 x 10$^{19}$ |
| Contact layer (grade) | $Ga_{0.x}In_{1-x}As$ x=0 to 0.5 | 500 | n> 1 x 10$^{19}$ |
| Emitter Cap | GaAs | 1000 | n 5 x 10$^{18}$ |
| Emitter | $In_{0.5}Ga_{0.5}P$ | 300 | n 3 x 10$^{17}$ |
| Base | $Ga_xIn_{1-x}As_yN_{1-y}$ | 500 | p 4 x 10$^{19}$ |
| Spacer | GaAs | 50 | — |
| Tunnel | $In_{0.5}Ga_{0.5}P$ | 100 | — |
| Collector | GaAs | 4000 | n 3 x 10$^{16}$ |
| Subcollector | GaAs | 7000 | n 5 x 10$^{18}$ |

FIG. 22

BIPOLAR TRANSISTOR

RELATED APPLICATIONS

This application is a continuation-in-part of U.S. application Ser. No. 10/121,444, filed Apr. 10, 2002 now U.S. Pat. No. 6,847,060, which is a continuation-in-part of U.S. application Ser. No. 09/995,079, filed Nov. 27, 2001 now U.S. Pat. No. 6,750,480, which claims the benefit of U.S. Provisional Application No. 60/253,159, filed Nov. 27, 2000, the teachings of all of which are incorporated herein in their entirety. U.S. application Ser. No. 10/121,444 also claims the benefit of U.S. Provisional Application No. 60/370,758, filed Apr. 5, 2002, and of U.S. Provisional Application No. 60/371,648, filed Apr. 10, 2002, the teachings of all of which are incorporated herein in their entirety.

GOVERNMENT SUPPORT

The invention was supported, in whole or in part, by a grant F33615-99-C-1510 from the Small Business Technology Transfer (STTR) Program of the United States Air Force. The Government has certain rights in the invention.

BACKGROUND OF THE INVENTION

Bipolar junction transistors (BJT) and heterojunction bipolar transistor (HBT) integrated circuits (ICs) have developed into an important technology for a variety of applications, particularly as power amplifiers for wireless handsets, microwave instrumentation, and high speed (>10 Gbit/s) circuits for fiber optic communication systems. Future needs are expected to require devices with lower voltage operation, higher frequency performance, higher power added efficiency, and lower cost production. The turn-on voltage ($V_{be,on}$) of a BJT or HBT is defined as the base-emitter voltage ($V_{be}$) required to achieve a certain fixed collector current density ($J_c$). The turn-on voltage can limit the usefulness of devices for low power applications in which supply voltages are constrained by battery technology and the power requirements of other components.

Unlike BJTs in which the emitter, base and collector are fabricated from one semiconductor material, HBTs are fabricated from two dissimilar semiconductor materials in which the emitter semiconductor material has a large band gap (also referred to as "energy gap") than the semiconductor material from which the base is fabricated. This results in a superior injection efficiency of carriers from the base to collector over BJTs because there is a built in barrier impeding carrier injection from the base back to the emitter. Selecting a base with a smaller band gap decreases the turn-on voltage because an increase in the injection efficiency of carriers from the base into the collector increases the collector current density at a given base-emitter voltage.

HBTs, however, can suffer from the disadvantage of having an abrupt discontinuity in the band alignment of the semiconductor material at the heterojunction can lead to a conduction band spike at the emitter-base interface of the HBT. The effect of this conduction band spike is to block electron transport out of the base into the collector. Thus, electron stay in the base longer resulting in an increased level of recombination and a reduction of collector current gain ($\beta_{dc}$). Since, as discussed above, the turn-on voltage of heterojunction bipolar transistors is defined as the base-emitter voltage required to achieve a certain fixed collector current density, reducing the collector current gain effectively raise the turn-on voltage of the HBT. Consequently, further improvements in the fabrication of semiconductor materials of HBTs are necessary to lower the turn-on voltage, and thereby improve low voltage operation devices.

SUMMARY OF THE INVENTION

The present invention provides an HBT having an n-doped collector, a base formed over the collector and composed of a semiconductor material, the average band gap of the base being at least about 10 meV less than the band gap of GaAs material, and the base being doped with carbon at a concentration of about $1.5 \times 10^{19}$ cm$^{-3}$ to about $7.0 \times 10^{19}$ cm$^{-3}$, and an n-doped emitter formed over the base. In certain embodiments, the base comprises a semiconductor material that is compositionally graded to provide a band gap that varies substantially linearly across the base, from a smaller bandgap at the collector junction to a larger bandgap at the emitter junction.

In one aspect, the HBT has a base layer comprised of a III-V material that includes indium and nitrogen. The III-V material of the base layer has a carbon dopant concentration of about $1.5 \times 10^{19}$ cm$^{-3}$ to about $7.0 \times 10^{19}$ cm$^{-3}$. In a preferred embodiment, the base layer includes the elements gallium, indium, arsenic, and nitrogen. The presence of indium and nitrogen reduces the band gap of the material relative to the band gap of GaAs. In addition, the dopant concentration in the material is high, the sheet resistivity ($R_{sb}$) is low. These factors result in a lower turn-on voltage relative to HBTs having a GaAs base layer with a similar dopant concentration.

In general, the base layer can comprise any suitable semiconductor material having a lower bandgap than the bandgap of GaAs (about 1.4 eV at room temperature). Preferably, the base is comprised of a non-strain relaxed material. Candidate materials include, without limitation, materials containing antimony (Sb), such as GaAsSb, GaAsSbN, and InGaAsSbN, as well as GaInAsN, GaInAs, and InNAs.

In a preferred embodiment, the III-V compound material system can be represented by the formula $Ga_{1-x}In_xAs_{1-y}N_y$. It is known that the energy-gap of $Ga_{1-x}In_xAs$ drops substantially when a small amount of nitrogen is incorporated into the material. Moreover, because nitrogen pushes the lattice constant in the opposite direction from indium, $Ga_{1-x}In_xAs_{1-y}N_y$ alloys can be grown lattice-matched to GaAs by adding the appropriate ratio of indium to nitrogen to the material. Thus, excess strain which results in an increased band gap and misfit dislocation of the material can be eliminated. The ratio of indium to nitrogen is thus selected to reduce or eliminate strain. In a preferred embodiment of the present invention, $x=3y$ in the $Ga_{1-x}In_xAs_{1-y}N_y$ base layer of the HBT.

In conventional HBTs having a GaAs, the current gain typically decreases with increasing temperature as a result of higher injection of holes to the emitter, higher space charge layer recombination current, and possible shorter diffusion length in the base. In HBTs having a GaInAsN base layer, a significant increase in current gain is found with increasing temperature (approximately 0.3% for each 1° C. rise). This result is interpreted as an increase in diffusion length with increasing temperature. Such an effect is expected if electrons at the bottom of the band are confined in states that are at least partially localized, and with increasing temperature they are thermally excited out of those states to others in which the electrons can diffuse more readily. Thus, engineering the base layer with GaInAsN improves temperature characteristics in HBTs of the invention and reduces the need for temperature compensation sub-circuitry.

HBTs having a GaInAsN base layer have improved common emitter output characteristics over conventional HBTs having a GaAs base layer. For example, HBTs having GaInAsN base layers have lower offset and knee voltages than conventional HBTs having a GaAs base layer.

In one embodiment, the transistor is a double heterojunction bipolar transistor (DHBT) having a base composed of a semiconductor material which is different from the semiconductor material from which the emitter and collector are fabricated. In a preferred embodiment of a DHBT, the $Ga_{1-x}In_xAs_{1-y}N_y$ base layer can be represented by the formula $Ga_{1-x}In_xAs_{1-y}N_y$, the collector is GaAs and the emitter is selected from InGaP, AlInGaP and AlGaAs.

Another preferred embodiment of the invention relates to a HBT or DHBT in which the height of the conduction band spike is lowered in combination with lowering of the base layer energy gap ($E_{gb}$). Conduction band spikes are caused by a discontinuity in the conduction band at the base/emitter heterojunction or the base/collector heterojunction. Reducing the lattice strain by lattice matching the base layer to the emitter and/or the collector layer reduces the conduction band spike. This is typically done by controlling the concentration of the nitrogen and the induim in the base layer. Preferably, the base layer has the formula $Ga_{1-x}In_xAs_{1-y}N_y$ wherein x is about equal to 3y.

In one embodiment, the base can be compositionally graded to produce a graded band gap layer having a smaller band gap at the collector and a larger band gap at the emitter. The base layer band gap is generally at least about 20 meV lower at a surface of the base layer proximate to the collector than at a surface of the base layer proximate to the emitter. In other embodiments, the base layer band gap is at least about 100 meV lower at a surface of the base layer proximate to the collector than at a surface of the base layer proximate to the emitter. In still further embodiments, the base layer band gap is at least about 300 meV lower at a surface of the base layer proximate to the collector than at a surface of the base layer proximate to the emitter. In still further embodiments, the base layer band gap is at least about 600 meV lower at a surface of the base layer proximate to the collector than at a surface of the base layer proximate to the emitter. Preferably, the base layer band gap is about 20 meV to about 120 meV lower at a surface of the base layer in contact with the collector than at a surface of the base layer in contact with the emitter. More preferably, the band gap of the base layer varies linearly across the base layer from the collector to the emitter.

Addition of nitrogen and indium to a GaAs semiconductor material lowers the band gap of the material. Thus, $Ga_{1-x}In_xAs_{1-y}N_y$ semiconductor materials have a lower band gap than that of GaAs. In compositionally graded $Ga_{1-x}In_xAs_{1-y}N_y$ base layers of the invention, the reduction in band gap of the base layer is larger at the collector than at the emitter. However, the average band gap reduction in comparison to the band gap GaAs across the base layer is, typically, about 10 meV to about 300 meV. In one embodiment, the average band gap reduction in comparison to the band gap GaAs across the base layer is, typically, about 80 meV to about 300 meV. In another embodiment, the average band gap reduction in comparison to the band gap GaAs across the base layer is, typically, about 10 meV to about 200 meV.

In general, the average band gap of the base in the HBT's of the present invention is at least about 10 meV less than the band gap of GaAs, and is typically between about 10 meV and about 600 meV less than the band gap of GaAs. In some embodiments, the average band gap of the base is at least about 80 meV less than the band gap of GaAs material. In still further embodiments, the average band gap of the base is at least about 180 meV less than the band gap of GaAs material.

This reduced band gap results in a lower turn-on voltage ($V_{be,on}$) for HBTs of the present invention, which have, for instance, a compositionally graded $Ga_{1-x}In_xAs_{1-y}N_y$ base layer, than for HBTs having a GaAs base layer because the principal determinant in $V_{be,on}$ is the intrinsic carrier concentration in the base. The intrinsic carrier concentration ($n_i$) is calculated from the following formula:

$$n_i = N_c N_v \exp(-E_g/kT)$$

In the above formula, $N_c$ is the effective density of conduction band states; $N_v$ is the effective density of valence band states; $E_g$ is the band gap; T is the temperature; and is Boltzmann constant. As can be seen from the formula, the intrinsic carrier concentration in the base is largely controlled by the band gap of the material used in the base.

Grading the band gap of the base layer from a larger band gap at the base-emitter interface to a smaller band gap at the base-collector interface introduces a quasielectric field, which accelerates electrons across the base layer in npn bipolar transistors. The electric field increases the electron velocity in the base, decreasing the base transit time which improves the RF (radiofrequency) performance and increases the collector current gain (also called dc current gain). The dc gain ($\beta_{dc}$), in the case of HBTs with heavily doped base layers, is limited by bulk recombination in the neutral base (n=1). The dc current gain can be estimated formula 1:

$$\beta_{dc} \approx v\tau/w_b \qquad (1)$$

In formula (1), v is the average minority carrier velocity in the base; $\tau$ is the minority carrier lifetime in the base; and $w_b$ is the base thickness. Properly grading the base layer in HBTs having a GaInAsN base layer results in a significant increase in $\beta_{dc}$ in comparison to a non-graded GaInAsN base layer due to the increased electron velocity.

To achieve a band gap that is graded over the thickness of the base layer, the base layer is prepared such that it has a higher concentration of particular materials, such as indium and/or nitrogen, at a first surface of the base layer, near the collector, than at a second surface of the base layer nearer the emitter. The change in the indium and/or nitrogen content preferably changes linearly across the base layer resulting in a linearly graded band gap. Preferably, the concentration of dopant (e.g., carbon) remains constant throughout the base layer. In one embodiment, a $Ga_{1-x}In_xAs_{1-y}N_y$ base layer, for example a base layer of a DHBT, is graded such that x and 3y are about equal to 0.01 at the collector and are graded to about zero at the emitter. In another embodiment, the $Ga_{1-x}In_xAs_{1-y}N_y$ base layer is graded from a value of x in the range of about 0.2 to about 0.02 at a surface of the base layer in contact with the collector to a value of x in the range of about 0.1 to zero at a surface of the base layer in contact with the emitter, provided that the value of x is larger at the surface of the base layer in contact with the collector than at the surface of the base layer in contact with the emitter. In this embodiment, y can remain constant throughout the base layer or can be linearly graded. When y is linearly graded, the base layer is graded from a value of y in the range of about 0.2 to about 0.02 at a surface of the base layer in contact with the collector to a value of y in the range of about 0.1 to zero at a surface of the base layer in contact with the emitter, provided that the value of y is larger at the surface of the base layer in contact with the collector than at the surface of the base layer in contact with the emitter. In a preferred embodiment, x is about 0.006 at the collector and is linearly graded to about 0.01 at the emitter. In a more preferred embodiment, x is about 0.006 at the collector and is linearly graded to about 0.01 at the emitter, and y is about 0.001 throughout the base layer.

In another embodiment, the invention is a method of forming a graded semiconductor layer having an essentially linear grade of band gap and an essentially constant doping-mobility product from a first surface through the layer to a second surface. The method includes:

a) comparing the doping-mobility product of calibration layers, each of which is formed at distinct flow rates of one of either an organometallic compound depositing aatom from Group III or V of the Periodic Table, or of a carbon tetrahalide compound depositing carbon, whereby the relative organometallic compound and carbon tetrahalide flow rates required to form an essentially constant doping-mobility product are determined; and b) flowing the organometallic and carbon tetrahalide compounds over a surface at said relative rates to form an essentially constant doping-mobility product, said flow rates changing during deposition to thereby form an essentially linear grade of band gap through the graded semiconductor layer.

The base layer can also be dopant-graded such that the dopant concentration is higher near the collector and decrease gradually across the thickness of the base to the base emitter heterojunction. This dopant grade can be combined with a compositional grade, as described above, to further enhance electron transport across the base layer.

Alternatively, the dopant concentration is higher near the emitter and decrease gradually across the thickness of the base to the base collector heterojunction. This dopant grade can be combined with a compositional grade, in particular, non-linear grade to further enhance electron transport across the base layer. A bipolar transistor employing a base that includes a non-uniform p-dopant concentration across the base layer and/or a non-uniformly graded band gap is described in U.S. Patent Application entitled BIPOLAR TRANSISTOR WITH ENHANCED BASE TRANSPORT, by Eric M. Rehder, et al., filed on Oct. 20, 2004 under Attorney Docket No. 0717.2056-000, the entire teachings of which are incorporated herein by reference.

Another method of minimizing the conduction band spike is to include one or more transitional layers at the heterojunction. Transitional layers having low band gap set back layers, graded band gap layers, doping spikes or a combination of thereof can be employed to minimize the conduction band spike. In addition, one or more lattice-matched layers can be present between the base and emitter or base and collector to reduce the lattice strain on the materials at the heterojunction.

The present invention also provides a method of fabricating an HBT and a DHBT. The method includes growing a base layer composed of gallium, indium, arsenic and nitrogen over an n-doped GaAs collector. The base layer can be grown employing internal and/or external carbon sources to provide a carbon-doped base layer. An n-doped emitter layer is then grown over the base layer. The use of an internal and external carbon source to provide the carbon dopant for the base layer can help form a material with a relatively high carbon dopant concentration. Typically, dopant levels of about $1.5 \times 10^{19}$ cm$^{-3}$ to about $7.0 \times 10^{19}$ cm$^{-3}$ are achieved using the method of the invention. In a preferred embodiment, dopant levels of about $3.0 \times 10^{19}$ cm$^{-3}$ to about $7.0 \times 10^{19}$ cm$^{-3}$ can be achieved with the method of the invention. A higher dopant concentration in a material reduces the sheet resistivity and band gap of the material. Thus, the higher the dopant concentration in the base layer of an HBT and DHBT, the lower the turn-on voltage of the device.

The present invention also provides a material represented by the formula $Ga_{1-x}In_xAs_{1-y}N_y$, in which x and y are each, independently, about $1.0 \times 10^{-4}$ to about $2.0 \times 10^{-1}$. Preferably, x is about equal to 3y. More preferably, x and 3y are about equal to 0.01. In one embodiment, the material is doped with carbon at a concentration of about $1.5 \times 10^{19}$ cm$^{-3}$ to about $7.0 \times 10^{19}$ cm$^{-3}$. In a specific embodiment, the carbon dopant concentration is about $3.0 \times 10^{19}$ cm$^{-3}$ to about $7.0 \times 10^{19}$ cm$^{-3}$.

The base layer designs described above can also be combined with alternative designs for the emitter and collector, including but not limited to: (1) multi-layer collectors; (2) a collector tunnel layer between the base and the collector; (3) field effect transistor (FET)/bipolar transistor combinations; and (4) emitters that incorporate ballast layers.

The reduction in turn-on voltage can result in better management of the voltage budget on both wired and wireless GaAs-based RF circuits, which are constrained either by standard fixed voltage supplies or by battery output. Lowering the turn-on voltage can also alter the relative magnitude of the various base current components in a GaAs-based HBT. DC current gain stability as a function of both junction temperature and applied stress has been previously shown to rely critically on the relative magnitudes of the base current components. A reduction in reverse hole injection enabled by a low turn-on voltage is favorable for both the temperature stability and long-term reliability of the device. Thus, relatively strain-free $Ga_{1-x}In_xAs_{1-y}N_y$ base materials having a high dopant concentration can significantly enhance RF performance in GaAs-based HBTs and DHBTs.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 1 illustrates a InGaP/GaInAsN DHBT structure of a preferred embodiment of the invention in which x is about equal to 3y.

FIG. 7a illustrates a preferred InGaP/GaInAsN DHBT structure which has a transitional layer between the emitter and the base and a transitional layer and lattice matched layer between the collector and the base.

FIGS. 7b and 7c illustrates a alternative InGaP/GaInAsN DHBT structure having compositionally graded base layers.

FIG. 13 is the structure of DHBTs having compositionally graded base layers used in the experiments in Example 2.

FIG. 14 is the structure of DHBTs having constant composition base layers used in the experiments in Example 2.

FIG. 22 is a table showing the composition of a DHBT having a graded GaInAsN base layer and a tunneling collector.

DETAILED DESCRIPTION OF THE INVENTION

Figure 2:
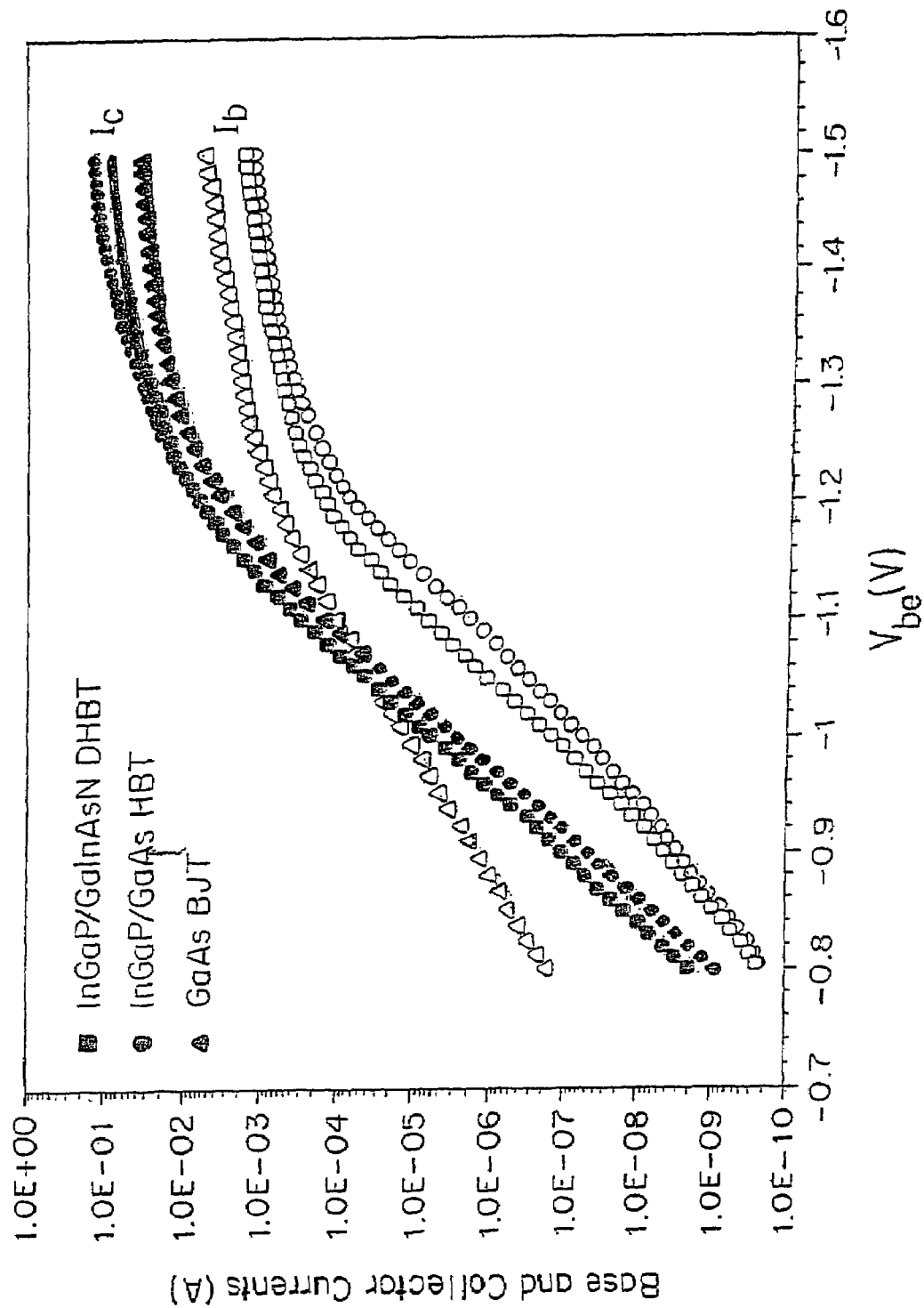
FIG. 2 is a Gummel plot which graphical illustrates the base and collector currents as a function of turn on voltage for an InGaP/GaInAsN DHBT of the invention and for an InGaP/GaAs HBT and a GaAs/GaAs BJT of the prior art.

A description of preferred embodiments of the invention follows.

A III-V material is a semiconductor having a lattice comprising at least one element from Column III(A) of the Periodic Table and at least one element from column V(A) of the Periodic Table. In one embodiment, the III-V material is a lattice comprised of gallium, indium, arsenic and nitrogen. Preferably, the III-V material can be represented by the formula $Ga_{1-x}In_xAs_{1-y}N_y$, wherein x and y are each, independently, about $1.0 \times 10^{-4}$ to about $2.0 \times 10^{-1}$. More preferably, x is about equal to 3y. In a most preferred embodiment, x and 3y are about 0.01.

The term "transitional layer," as used herein, refers to a layer that is between the base/emitter heterojunction or the base/collector heterojunction and has the function of minimizing the conduction band spike of the heterojunction. One method of minimizing the conduction band spike is to use a series of transitional layers wherein the band gaps of the transitional layers gradually decrease from the transitional layer nearest in proximity to the collector to the transitional layer nearest in proximity to the base in a base/collector heterojunction. Likewise, in a emitter/base heterojunction, the band gaps of the transitional layers gradually decrease from the transitional layer nearest in proximity to the emitter to the transitional layer nearest in proximity to the base. Another method of minimizing the conduction band spike is to use a transitional layer having a graded band gap. The band gap of a transitional layer can be graded by grading the dopant concentration of the layer. For example, the dopant concentration of the transitional layer can be higher near the base layer and can be gradually decreased near the collector or the emitter. Alternatively, lattice strain can be used to provide a transitional layer having a graded band gap. For example, the transitional layer can be compositionally graded to minimize the lattice strain at the surface of the layer in contact with the base and increase the lattice strain at the surface in contact with the collector or emitter. Another method of minimizing the conduction band spike is to use a transitional layer having a spike in the dopant concentration. One or more of the above-described methods for minimizing the conduction band spike can be used in the HBTs of the invention. Suitable transitional layers for the HBTs of the invention include GaAs, InGaAs and InGaAsN.

A lattice-matched layer is a layer which is grown on a material having a different lattice constant. The lattice-matched layer typically has a thickness of about 500 Å or less and essentially conforms to the lattice constant of the underlying layer. This results in a band gap intermediate between the band gap of the underlying layer and the band gap of the lattice-matched material if it were not strained.

Methods of forming lattice-matched layers are known to those skilled in the art and can be found in on pages 303-328 of Ferry, et al., *Gallium Arsenide Technology* (1985), Howard W. Sams & Co., Inc. Indianapolis, Ind. the teachings of which are incorporated herein by reference. An example of a suitable material for lattice-matched layers of the HBTs of the invention is InGaP.

HBTs and DHBTs with Constant-Composition Base Layers

The HBTs and DHBTs of the invention can be prepared using a suitable metalorganic chemical vapor deposition (MOCVD) epitaxial growth system. Examples of suitable MOCVD epitaxial growth systems are AIXTRON 2400 and AIXTRON 2600 platforms. In the HBTs and the DHBTs prepared by the method of the invention, typically, an un-doped GaAs buffer layer can be grown after in-situ oxide desorption. For example, a subcollector layer containing a high concentration of an n-dopant (e.g., dopant concentration about $1 \times 10^{18}$ cm$^{-3}$ to about $9 \times 10^{18}$ cm$^{-3}$) can be grown at a temperature of about 700° C. A collector layer with a low concentration of a n-dopant (e.g., dopant concentration about $5 \times 10^{15}$ cm$^{-3}$ to about $5 \times 10^{16}$ cm$^{-3}$) can be grown over the subcollector at a temperature of about 700° C. Preferably, the subcollector and the collector are GaAs. The subcollector layer typically has a thickness of about 4000 Å to about 6000 Å, and the collector typically has a thickness of about 3000 Å to about 5000 Å. In one embodiment, the dopant in the subcollector and/or the collector is silicon.

Optionally, a lattice-match InGaP tunnel layer can be grown over the collector under typical growth conditions. A lattice-matched layer generally has a thickness of about 500 Å or less, preferably about 200 Å or less, and has a dopant concentration of about $1 \times 10^{16}$ cm$^{-3}$ to about $1 \times 10^{18}$ cm$^{-3}$.

One or more transitional layers can optionally be grown under typical growth conditions on the lattice-matched layer or on the collector if no lattice-match layer is used. Transitional layer can be prepared from n-doped GaAs, n-doped InGaAs or n-doped InGaAsN. Transitional layers optionally can be compositionally or dopant graded or can contain a dopant spike. Transitional layers typically have a thickness of about 75 Å to about 25 Å. The carbon doped GaInAsN base layer was grown over the collector if neither a lattice-matched or a transitional layer was used.

The base layer is grown at a temperature below about 750° C. and typically is about 400 Å to about 1500 Å thick. In a preferred embodiment, the base layer is grown at a temperature of about 500° C. to about 600° C. Optionally, the carbon doped GaInAsN base layer can be grown over the transitional layer or over the lattice-matched layer if a transitional layer is not used. The base layer can be grown using a suitable gallium source, such as trimethylgallium or triethylgallium, an arsenic source, such as arsine, tributylarsine or trimethylarsine, an indium source, such as trimethylindium, and a nitrogen source, such as ammonia or dimethylhydrazine. A low molar ratio of the arsenic source to the gallium source is preferred. Typically, the molar ratio of the arsenic source to the gallium source is less than about 3.5. More preferably, the ratio is about 2.0 to about 3.0. The levels of the nitrogen and indium sources are adjusted to obtain a material which was composed of about 0.01% to about 20% indium and about 0.01% to about 20% nitrogen. In a preferred embodiment, the indium content of the base layer is about three times higher than the nitrogen content. In a more preferred embodiment, the indium content is about 1% and the nitrogen content is about 0.3%. In the present invention, a GaInAsN layer having a high carbon dopant concentration of about $1.5 \times 10^{19}$ cm$^{-3}$ to about $7.0 \times 10^{19}$ cm$^{-3}$ can be obtained by using an external carbon source organometallic source, specifically, the gallium source. An example of a suitable external carbon source is carbon tetrabromide. Carbon tetrachloride is also an effective external carbon source.

In addition to the GaInAsN material described above, the base layer can comprise any suitable semiconductor material having a lower bandgap than the bandgap of GaAs, including, for example, GaAsSb, GaAsSbN, InGaAsSbN, GaInAsN, GaInAs, and InNAs.

Optionally, one or more transitional layers can be grown of n-doped GaAs, n-doped InGaAs or n-doped InGaAsN between the base and the emitter. Transitional layers between the base and emitter are relatively lightly doped (e.g., about $5.0 \times 10^{15}$ cm$^{-3}$ to about $5.0 \times 10^{16}$ cm$^{-3}$) and optionally contain a dopant spike. Preferably, transitional layers are about 25 Å to about 75 Å thick.

An emitter layer is grown over the base, or optionally over a transitional layer, at a temperature of about 700° C. and is typically about 400 Å to about 1500 Å thick. The emitter layer includes, for example, InGaP, AlInGaP, or AlGaAs. In a preferred embodiment, the emitter layer includes InGaP. The emitter layer can be n-doped at a concentration of about $1.0 \times 10^{17}$ cm$^{-3}$ to about $9.0 \times 10^{17}$ cm$^{-3}$. An emitter-contact layer that includes GaAs containing a high concentration of an n-dopant (e.g., about $1.0 \times 10^{18}$ cm$^{-3}$ to about $9 \times 10^{18}$ cm$^{-3}$) optionally is grown over the emitter at a temperature of about 700° C. Typically, the emitter contact layer is about 1000 Å to about 2000 Å thick.

A InGaAs layer with a ramped-in indium composition and a high concentration of an n-dopant (e.g., about $5 \times 10^-$cm$^{-3}$ to about $5 \times 10^{19}$ cm$^{-3}$) is grown over the emitter contact layer. This layer typically is about 400 Å to about 1000 Å thick.

EXAMPLE 1

To illustrate the effect of reducing the band gap of the base layer and/or minimizing the conduction band spike at the emitter/base heterojunction, three different types of GaAs-based bipolar transistor structures were compared: GaAs emitter/GaAs base BJTs, InGaP/GaAs HBTs, and InGaP/GaInAsN DHBTs of the invention. A general representation of InGaP/GaInAsN DHBT structures used in the following experiments is illustrated in FIG. 1. There is only one heterojunction at the emitter/base interface since the base and the collector are both formed from GaAs. The GaAs base layer of the InGaP/GaAs HBT has a larger band gap than the base of the InGaP/GaInAsN DHBT. GaAs/GaAs BJTs have no heterojunctions since the emitter, collector and base are all made of GaAs. Thus, GaAs BJT structures are used as a reference to determine what impact, if any, a conduction band spike at the base-emitter interface has on the collector current characteristics of InGaP/GaAs HBTs. In the DHBTs of FIG. 1, InGaP is chosen as the emitter material with the $Ga_{1-x}In_xAs_{1-y}N_y$ base because InGaP has a wide band gap, and its conduction band lines up with the conduction band of the $Ga_{1-x}In_xAs_{1-y}N_y$ base. Comparison of the InGaP/GaInAsN DHBTs of FIG. 1 and the InGaP. GaAs HBTs are used to determine the effect on collector current density of having a base layer with a lower band gap.

All of the GaAs devices used in the following discussion have MOCVD-grown, carbon-doped base layers in which the dopant concentration varied from about $1.5 \times 10^{19}$ cm$^{-3}$ to about $6.5 \times 10^{19}$ cm$^{-3}$ and a thickness varied from about 500 Å to about 1500 Å, resulting in a base sheet resistivity ($R_{sb}$) of between 100 Ω/□ and 400 Ω/□. Large area devices (L=75 μm×75 μm) were fabricated using a simple wet-etching process and tested in the common base configuration. Relatively small amounts of indium (x~1%) and nitrogen (y~0.3%) were added incrementally to form two separate sets of InGaP/GaInAsN DHBTs. For each set, growth has been optimized to maintain high, uniform carbon dopant levels (>2.5×10$^{19}$ cm$^{-3}$), good mobility (~85 cm$^2$/V-s), and high dc current gain (>60 at $R_{sb}$~300Ω/□).

Typical Gummel plots from a GaAs/GaAs BJT, an InGaP/GaAs HBT and an InGaP/GaInAsN DHBT with comparable base sheet resistivities were plotted and overlaid in FIG. 2. The collector currents of the InGaP/GaAs HBT and GaAs/GaAs BJT were indistinguishable for over five orders of magnitude (decades) of current until differences in effective series resistance impacted the current-voltage characteristics. On the other hand, the collector current of an InGaP/GaInAsN DHBT was two-fold higher than the collector current of the GaAs/GaAs BJT and the InGaP/GaAs HBT over a wide bias range, corresponding to a 25.0 mV reduction in turn-on voltage at a collector current density ($J_c$) of 1.78 A/cm$^2$. The observed increase in the low-bias base current (n=2 component) in the BJT is consistent with an energy-gap driven increase in space charge recombination. The neutral base recombination component of the base current in the InGaP/GaInAsN DHBT was driven higher than in the InGaP/GaAs HBT because of the increase in collector current, as well as reduction in the minority carrier lifetime or an increase in the carrier velocity ($I_{nbr}=I_cw_b/vr$). InGaP/GaInAsN DHBT devices prepared to-date have achieved a peak dc current gain of 68 for a device having a base sheet resistivity of 234 Ω/□, corresponding to a decrease in turn-on voltage of 11.5 mV, and a peak dc current gain of 66 for a device having a base sheet resistivity of 303 Ω/□, corresponding to a decrease in turn-on voltage of 25.0 mV. This represents the highest known gain-to-base-sheet-resistance ratios ($\beta/R_{sb}$~0.2-0.3) for these types of structures. The energy-gap reduction in the Ga$_{1-x}$In$_x$As$_{1-y}$N$_y$ base, is responsible for the observed decrease in turn-on voltage, as demonstrated by low temperature (77° K.) photoluminescence. DCXRD measurements indicate the lattice mismatch of the base layer is minimal (<250 arcsec).

In the diffusive limit, the ideal collector current density of a bipolar transistor as a function of base-emitter voltage ($V_{be}$) can be approximated as:

$$J_c=(qD_nn^2_{ib}/p_bw_b)exp(qV_{be}/kT) \quad (2)$$

where $p_b$ and $w_b$ base doping and width;
$D_n$ diffusion coefficient;
$n_{ib}$ intrinsic carrier concentration in the base.

By expressing $n_{ib}$ as a function of base layer energy-gap ($E_{gb}$) and rewriting the product of base doping and thickness in terms of base sheet resistivity ($R_{sb}$), the turn-on voltage can be expressed as a logarithmic function of base sheet resistance $$V_{be}=-A\, ln[R_{sb}]+V_o \quad (3)$$

with $$A=(kT/q) \quad (4)$$

and $$V_o=E_{gb}/q-(kT/q)ln[q^2\mu N_cN_v D_n/J_c] \quad (5)$$

where $N_c$ and $N_v$ are the effective density of states in the conduction and valence bands and μ is the majority carrier mobility in the base layer.

Figure 3:
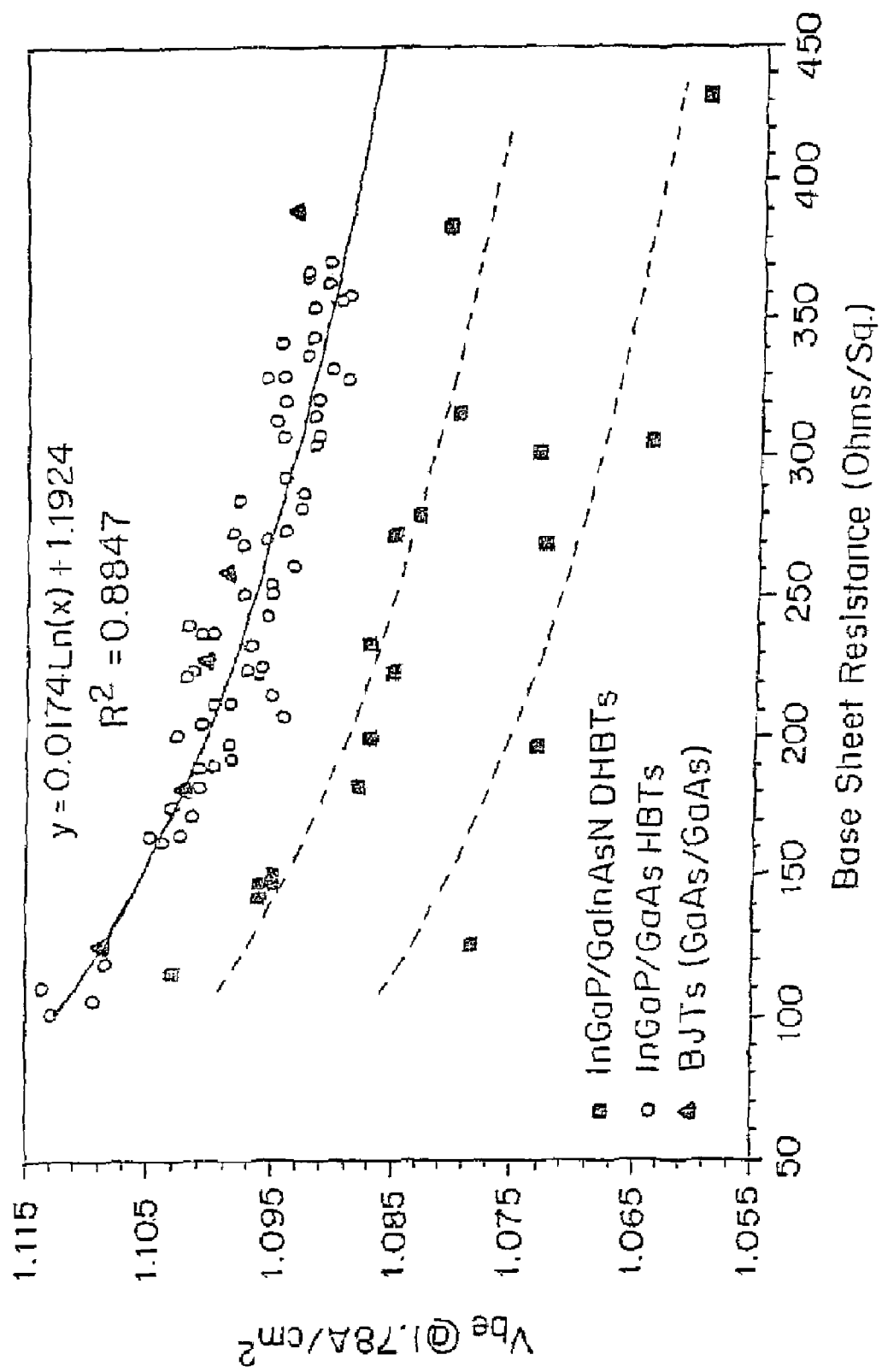
FIG. 3 is a graphical illustration of turn on voltage (at $J_c$=1.78 A/cm$^2$) as a function of base sheet resistance for an InGaP/GaInAsN DHBT of the invention and for an InGaP/GaAs HBT and a GaAs/GaAs BJT of the prior art.

FIG. 3 plots the turn-on voltage at $J_c$=1.78 A/cm$^2$ as a function of base sheet resistivity for a number of InGaP/GaAs HBTs, GaAs/GaAs BJTs, and InGaP/GaInAsN DHBTs. The turn-on voltage of both the InGaP/GaAs HBTs and the GaAs/GaAs BJTs, which do not have any conduction band spike, qualitatively exhibit the same logarithmic dependence on base sheet resistivity expected from equation (2). Quantitatively, the variation of base-emitter voltage ($V_{be}$) with base sheet resistivity is less severe than represented by equation (3) (A=0.0174 instead of 0.0252 mV). However, this observed reduction in A is consistent with the quasiballistic transport through thin base GaAs bipolar devices.

Comparison with the characteristics of GaAs/GaAs BJTs leads to the conclusion that the effective height of the conduction band spike InGaP/GaAs HBTs can be zero, with the collector current exhibiting ideal (n=1) behavior. Thus, InGaP/GaAs HBTs can be engineered to have essentially no conduction band spike. Similar results were found by previous work for AlGaAs/GaAs HBTs. To further lower the turn-on voltage for these devices for a fixed base sheet resistivity requires the use of a base material with a lower energy gap but which still maintains the conduction band continuity. Ga$_{1-x}$In$_x$As$_{1-y}$N$_y$ can be used to reduce $E_{gb}$ while maintaining near lattice-matching conditions. As seen in FIG. 3, the turn-on voltage of two sets of InGaP/GaInAsN DHBTs follows a logarithmic dependence on base sheet resistivity indicating that the conduction band spike is about zero. In addition, the turn-on voltage is shifted downward by 11.5 mV in one set and by 25.0 mV in the other set (dashed lines) from that observed for InGaP/GaAs HBTs and GaAs/GaAs BJTs.

The above experiment shows that the turn-on voltage of GaAs-based HBTs can be reduced below that of GaAs BJTs by using a InGaP/GaInAsN DHBT structure. A low turn-on voltage is achieved through two key steps. The base-emitter interface is first optimized to suppress the conduction band spike by selecting base and emitter semiconductor materials in which the conduction bands are at about the same energy level. This is successfully done using InGaP or AlGaAs as the emitter material and GaAs as the base. A further reduction in turn-on voltage was then accomplished by lowering the band gap of the base layer. This was achieved while still maintaining lattice matching throughout the entire HBT structure by adding both indium and nitrogen to the base layer. With proper growth parameters, a two-fold increase in collector current density was achieved without significantly sacrificing base doping or minority carrier lifetime (β=68 at $R_{sb}$=234 Ω/□). These results indicate that the use of a Ga$_{1-x}$In$_x$As$_{1-y}$N$_y$ material provides a method for lowering the turn-on voltage in GaAs-based HBTs and DHBTs. Since incorporation of indium and nitrogen in GaAs lowers the band gap of the material, larger reductions in turn-on voltage within GaAs based HBTs and DHBTs are expected as a larger percentage of indium and nitrogen is incorporated into the base if a high p-type doping concentration is maintained.

Figure 4:
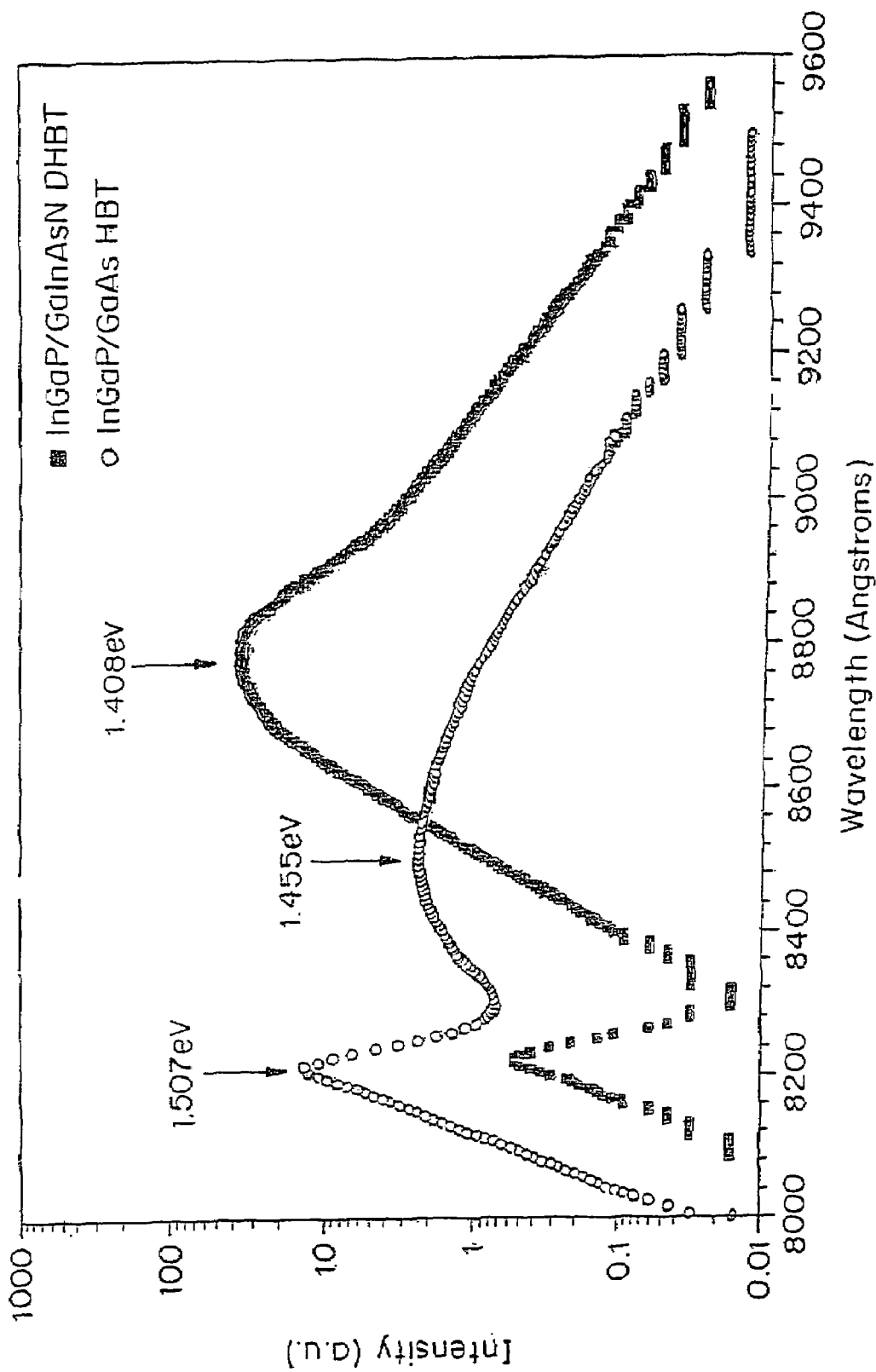
FIG. 4 illustrates the photoluminescence spectra measured at 77° K. of an InGaP/GaInAsN DHBT of the invention and of an InGaP/GaAs HBT of the prior art, both with a nominal base thickness of 1000 Å. Photoluminescence measurements were taken after etching off the InGaAs and GaAs cap layers, selectively stopping at the top of the InGaP emitter. The band gap of the n-type GaAs collector of both the InGaP/GaAs HBT and the InGaP/GaInAsN DHBT was 1.507 eV. The band gap of the p-type GaAs base layer of the InGaP/GaAs HBT was 1.455 eV, whereas the band gap of the p-type GaInAsN base layer of the InGaP/GaInAsN was 1.408 eV.

The energy-gap reduction in the GaInAsN base, assumed to be responsible for the observed decrease in turn-on voltage, has been confirmed by low temperature (77° K.) photoluminescence. FIG. 4 compares photoluminescence spectra from an InGaP/GaInAsN DHBT and a conventional InGaP/GaAs HBT. The base layer signal from the InGaP/GaAs HBT is at a lower energy than the collector (1.455 eV vs. 1.507 eV) because of band-gap-narrowing effects associated with high-doping-levels. The base layer signal from the InGaP/GaInAsN DHBT which appears at 1.408 eV is reduced because of band-gap-narrowing effects and a reduction in the base layer energy gap caused by incorporation of indium and nitrogen in the base layer. In this comparison, the doping levels are comparable, suggesting the 47 meV reduction in the position of the base layer signal can be equated to a reduction in the base layer energy gap in the GaInAsN base as compared with the energy gap of the GaAs base. This shift in photoluminescence signal correlates very well with the measured 45 mV reduction in turn-on voltage. In the absence of a conduction band spike, the turn-on voltage reduction can be directly related to the decrease in base layer energy gap.

Figure 5:
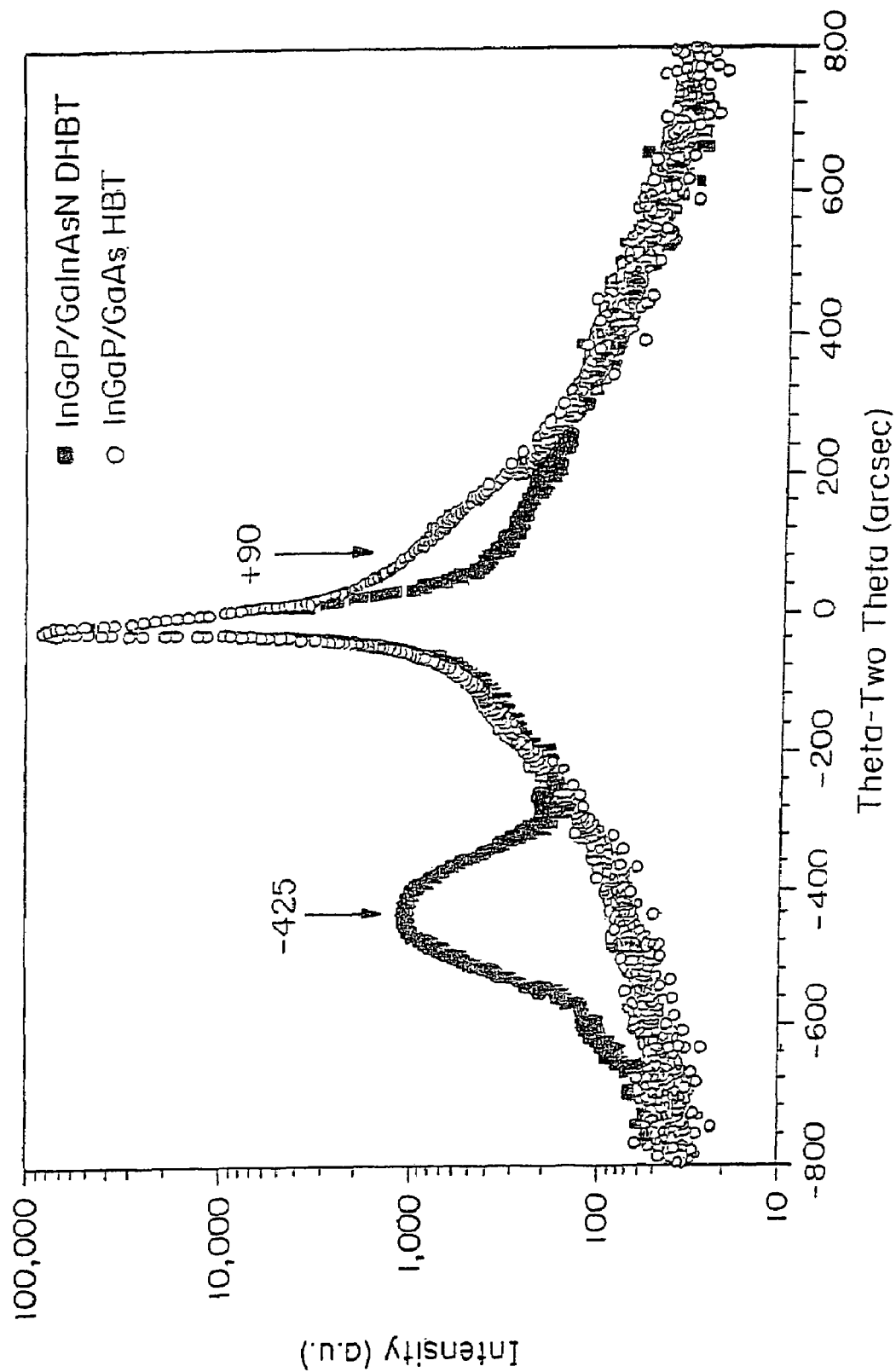
FIG. 5 illustrates double crystal x-ray diffraction (DCXRD) spectra of a InGaP/GaInAsN DHBT of the invention and a InGaP/GaAs HBT of the prior art, both having a nominal base thickness of 1500 Å. The positions of the base layers peaks are marked.

The DCRXD spectra shown in FIG. 5 illustrates the effect of addition of carbon dopants and indium to a GaAs semiconductor. FIG. 5 shows the DCRXD spectra from both an InGaP/GaInAsN DHBT and a standard InGaP/GaAs HBT of comparable base thickness. In the InGaP/GaAs HBT, the base layer is seen as a shoulder on the right hand side of the GaAs substrate peak, approximately corresponding to a position of +90 arcsecs, due to the tensile strain generated from the high carbon dopant concentration of $4 \times 10^{19}$ cm$^{-3}$. With the addition of indium, the base layer peak is at $-425$ arcsec in this particular InGaP/GaInAsN DHBT structure. In general, the position of the peak associated with the GaInAsN base is a function of the indium, nitrogen, and carbon concentrations. The addition of indium to GaAs adds a compressive strain, while both carbon and nitrogen compensate with a tensile strain.

Figure 6:
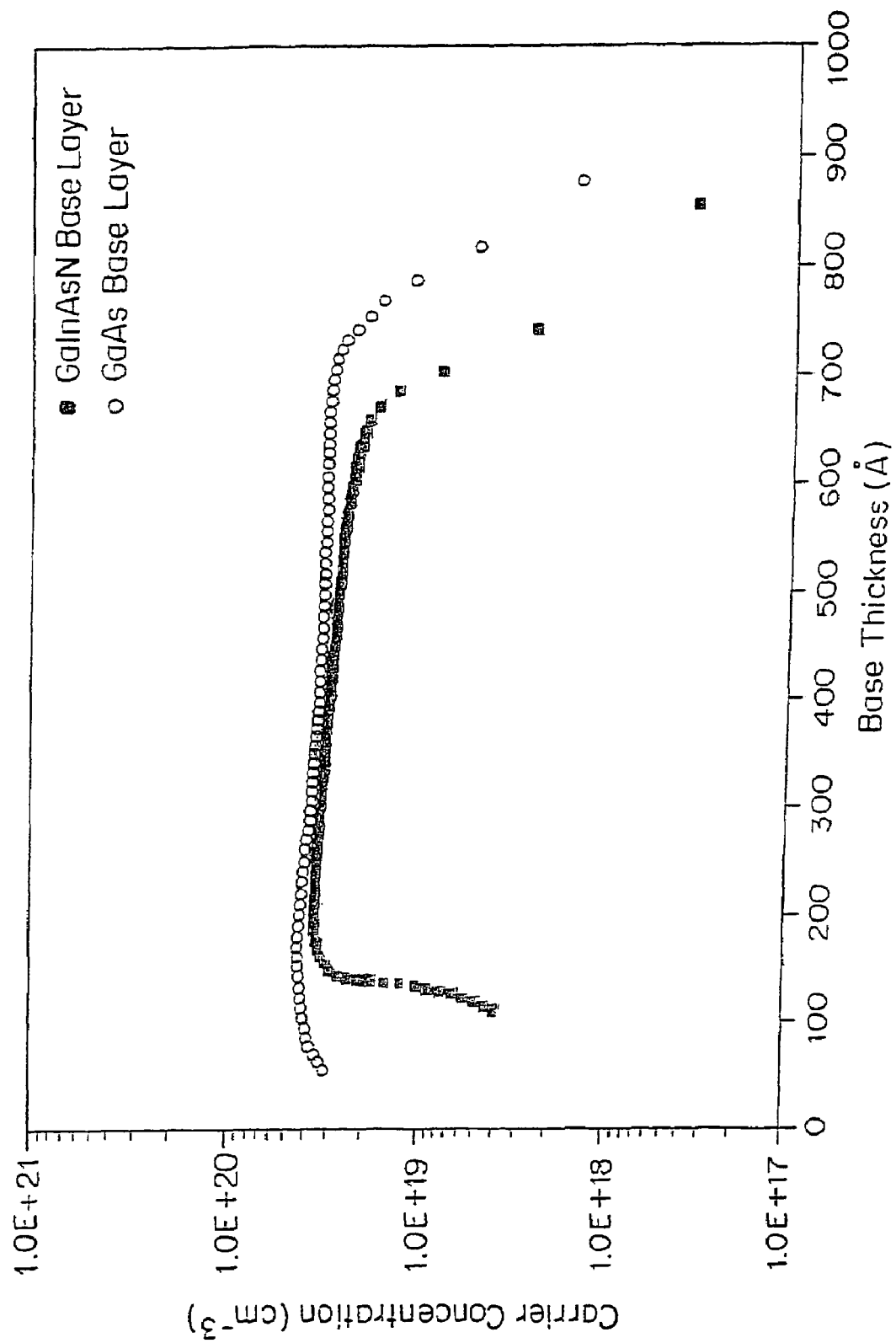
FIG. 6 is a Polaron C-V profile which illustrates the carrier concentration across the thickness of the base layer in an InGaP/GaInAsN DHBT of the invention and an InGaP/GaAs HBT of the prior art. Both the InGaP/GaInAsN DHBT and an InGaP/GaAs HBT have a nominal base thickness of 1000 Å. Both Polaron profiles are obtained after selectively etching down to the top of the base layer.

Maintaining high p-type doping levels as indium (and nitrogen) are added to carbon doped GaAs requires careful growth optimization. A rough estimate of the active doping level can be obtained from a combination of measured base sheet resistivity and base thickness values. The base doping can also be confirmed by first selectively etching to the top of the base layer and then obtaining a Polaron C-V profile. FIG. 6 compares such Polaron C-V doping profiles from a GaAs base layer and a GaInAsN base layer. In both case, doping levels exceeded $3 \times 10^{19}$ cm$^{-3}$.

FIG. 7a shows an alternative structure for DHBTs having constant composition GaInAsN base layer (10) that employs transitional layers (20 and 30) between the emitter/base and the collector/base junction. In addition, a lattice-match InGaP tunnel layer (40) is employed between the transitional layer and the collector.

DHBTs with Compositionally-Graded Base Layers

All layers in DHBTs having a compositionally-graded base layer can be grown in a similar fashion as DHBTs having a base with a constant composition except the base layer as a graded band gap firm one junction through the layer to another junction of the transistor. For example, a carbon-doped and bond gap-graded GaInAsN base layer can be grown over the collector if neither a lattice-matched nor a transitional layer is used. Optionally, the carbon doped graded GaInAsN base layer can be grown over the transitional layer or over the lattice-matched layer if a transitional layer was not used. The base layer can be grown at a temperature below about 750° C. and typically is about 400 Å to about 1500 Å thick. In one embodiment, the base layer is grown at a temperature of about 500° C. to about 600° C. The base layer can be grown using a gallium source, such as, for example, trimethylgallium or triethylgallium, an arsenic source, such as arsine, tri(t-butyl)arsine or trimethylarsine, an indium source, such as trimethylindium, and a nitrogen source, such as ammonia, dimethylhydrazine or t-butylamine. A low molar ratio of the arsenic source to the gallium source is preferred. Typically, the ratio molar ratio of the arsenic source to the gallium source is less than about 3.5.

More preferably, the ratio is about 2.0 to about 3.0. The levels of the nitrogen and indium sources can be adjusted to obtain a material in which the content of the Group III element is about 0.01% to about 20% indium and the content of the Group V element is about 0.01% to about 20% nitrogen. In a specific embodiment, the content of the Group III element that is indium is varied from about 10% to 20% at the base-collector junction to about 0.01% to 5% at the base-emitter junction and the content of the Group V element that is nitrogen essentially is constant at about 0.3%. In another embodiment, the nitrogen content of the base layer is about three times lower than the indium content. As discussed above in regard to GaInAsN base layers having a constant composition, it is believed that a GaInAsN layer having a high carbon dopant concentration, of about $1.5 \times 10^{19}$ cm$^{-3}$ to about $7.0 \times 10^{19}$ cm$^{-3}$, can be achieved by using an external carbon source, such as a carbon tetrahalide, in addition to the gallium source. The external carbon source used can be, for example, carbon tetrabromide. Carbon tetrachloride is also an effective external carbon source.

Since organoindium compounds that are used as the indium source gas contribute a different amount of carbon dopant to the GaInAsN base layer than the organogallium compounds that are used as the gallium source gas, the carbon dopant source gas flow typically is adjusted during the growth of the base layer so as to maintain a constant carbon doping concentration in the compositionally-graded GaInAsN base layer. In one embodiment, change in the carbon source gas flow over the compositionally graded base layer is determined using the method described below.

Carbon and Trimethylindium Source Flow Rate Calibration Procedure for Graded GaInAsN and/or Graded InGaAs Semiconductor Layers At least two sets of calibration HBTs are prepared, in which each set contains at least two members (DHBTs can be used instead of HBTs). The base layer thickness is ideally the same for all calibration HBTs formed but is not a requirement, and each HBTs has a constant composition, such as a constant composition of GaInAsN or GaInAs base layer and a constant carbon dopant concentration throughout the layer. Each set is grown at a different Group III or Group V additive (such as indium for Group III or nitrogen for Group V) source gas flow rate than another set so that the members of each set have a different gallium, indium, arsenic and nitrogen composition than that of members of a different set. By way of example, indium will be employed as the additive which affects band gap gradation. Each member of a particular set is grown at a different external carbon source (e.g., carbon tetrabromide, or carbon tetrachloride) flow rate so that each member of a particular set has a different carbon dopant level. The doping*mobility product is determined for each member and graphed against the carbon source flow rate. The doping*mobility product varies proportionately with the carbon source gas flow rate for the members of each set. Doping*mobility product vs. carbon tetrabromide flow rate for five sets of HBTs is graphed in FIG. 8. Alternatively, each set of calibration HBTs could be formed by maintaining a constant flow rate of the carbon source gas, such as carbon tetrabromide, and each separate sample in each set could be formed at a distinct Group III or Group V additive flow rate relative to the flow rate of the other sources gases.

Figure 8:
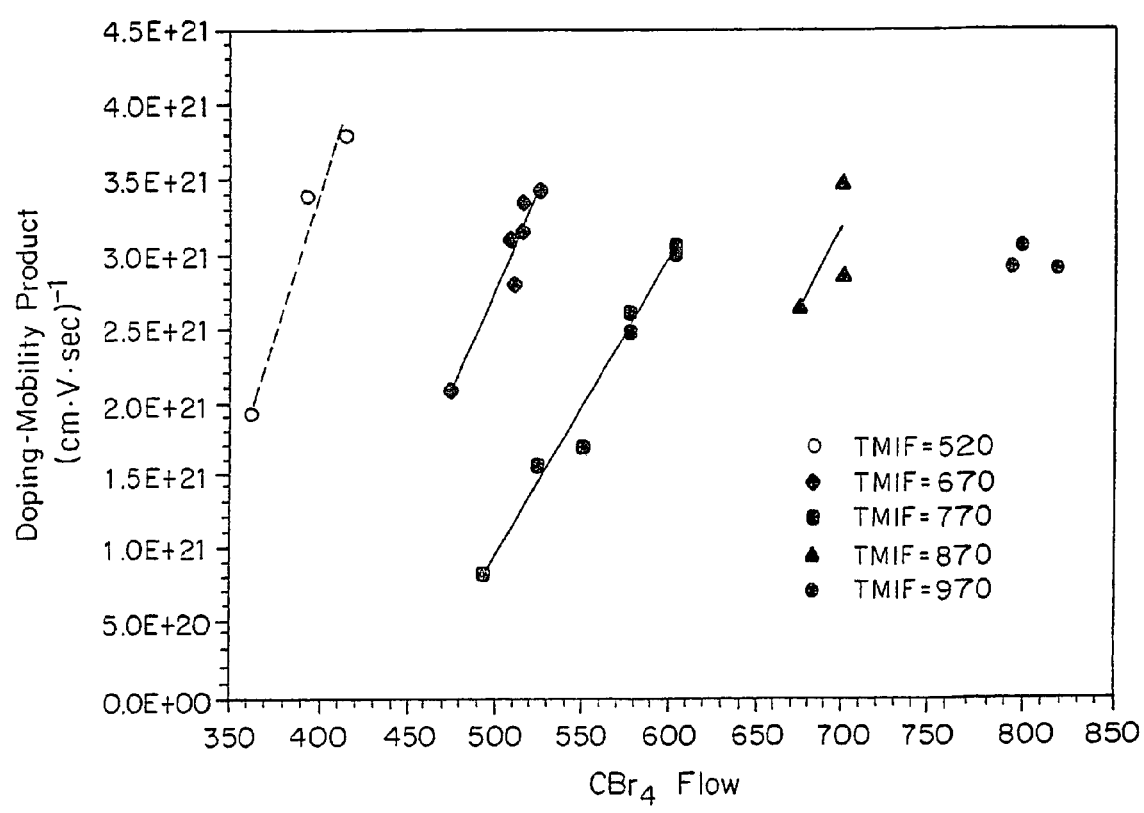
FIG. 8 is a graph of the doping*mobility produce as a function of carbon tetrabromide flow rate in a carbon doped GaInAsN base layers grown at a constant indium source gas flow rate ("TMIF" is the trimethyl indium flow rate).

The flow rate of carbon source gas versus indium source gas needed to obtain a constant doping*mobility product is obtained by drawing a line across the graph in FIG. 8 at a constant doping*mobility product (e.g., a line parallel to the x-axis). Where this line intersects with the straight lines of each set represents the external carbon source flow needed to obtain this doping*mobility product value when the indium source gas flow is set at the flow rate for that set. The external carbon source gas flow rate versus indium source gas flow rate for one constant doping*mobility product value is graphed in FIG. 9. Similar lines for different doping*mobility products can be graphed in the same way.

Figure 10:
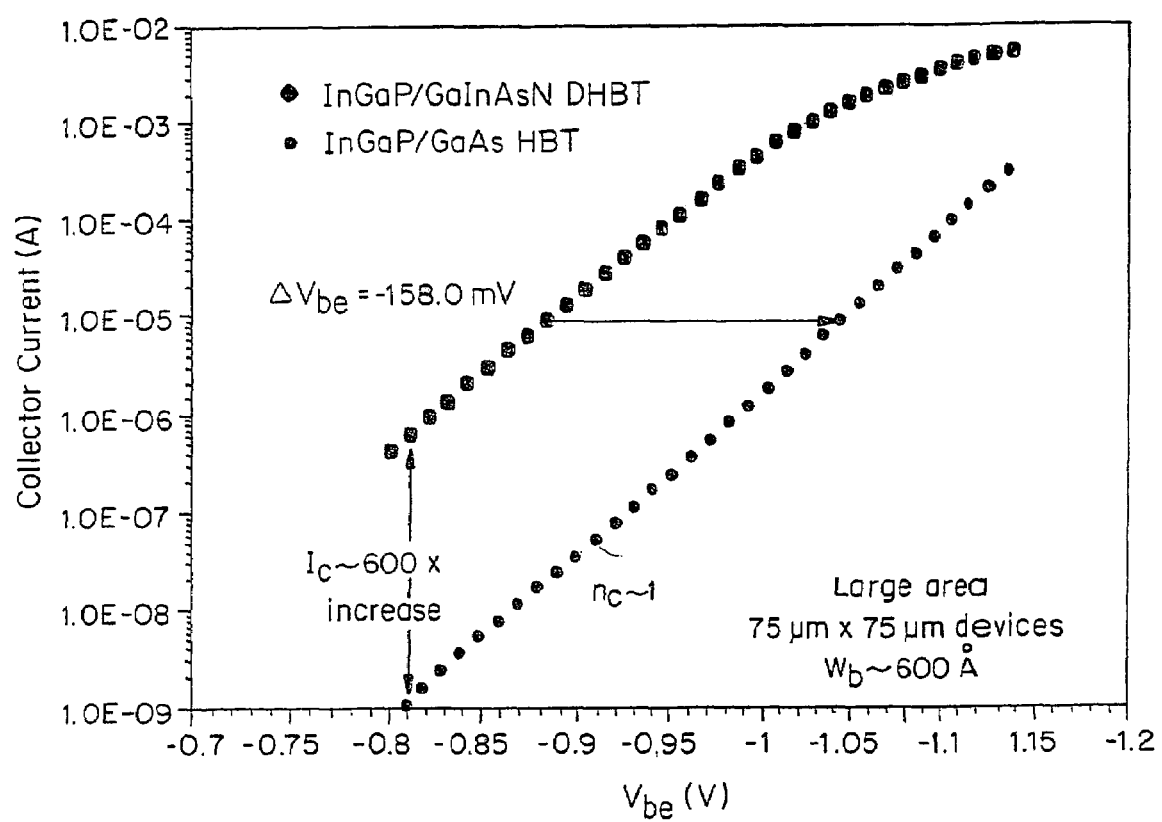
FIG. 10 is a graph showing that InGaP/GaInAsN HBTs have a lower turn-on voltage than InGaP/GaAs HBTs.
Figure 11:
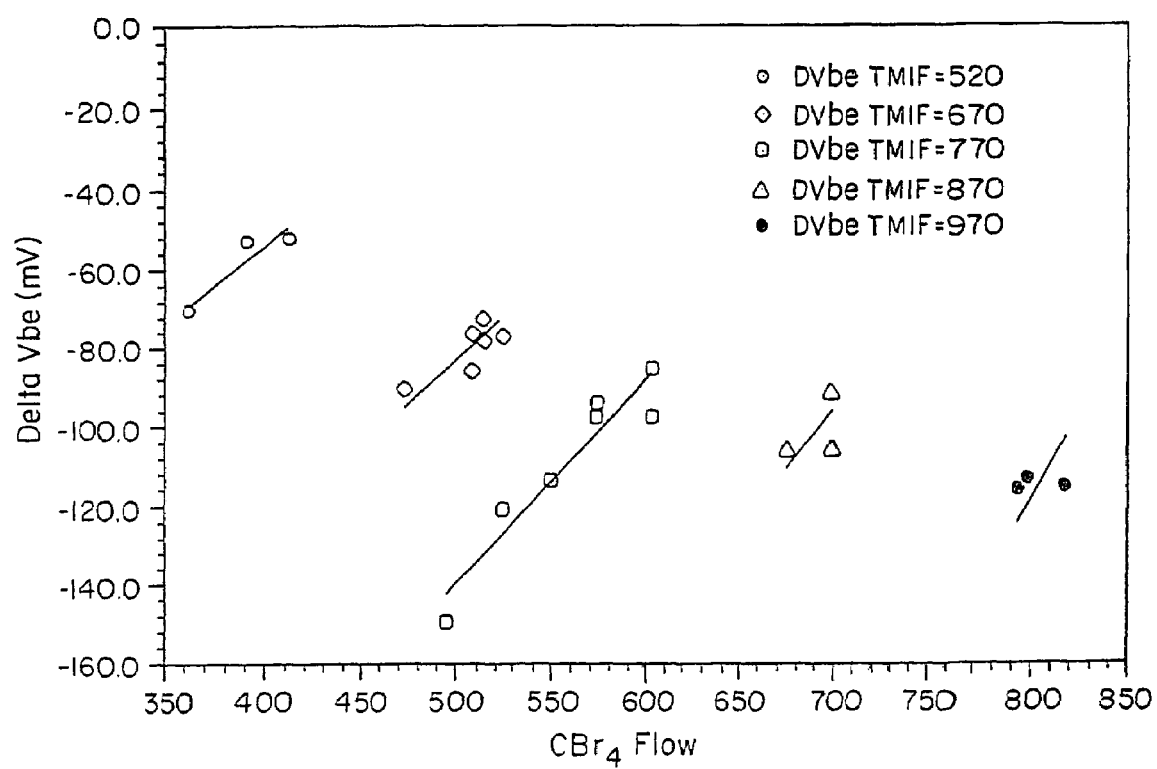
FIG. 11 is a graph of the $\Delta V_{be}$ versus carbon tetrabromide flow rate of carbon doped GaInAsN base layers grown at a constant TMIF.

The collector current of each HBT is graphed as a function of base-emitter voltage ($V_{be}$) and the curve obtained is compared to a graph of an HBT that has a GaAs base layer but otherwise is identical to the member in the set to which it is compared (e.g., has the same dopant concentration, the same thickness of base, emitter and collector layers, ect.). The voltage difference between the curves at a particular collector current is the change in the base emitter voltage, $V_{be}$ ($\Delta V_{be}$), attributed to the lower energy gap of the base layer caused by addition of indium and nitrogen during formation of the base layer. FIG. 10 shows a plot of the collector current as a function of $V_{be}$ for an HBT having a GaInAsN base layer and an HBT having a base layer of GaAs. The horizontal arrow drawn between the two curves is the $\Delta V_{be}$. The $\Delta V_{be}$ for each member of all the sets is determined and plotted vs. carbon source gas flow. The $\Delta V_{be}$ vs. carbon tetrabromide flow for each member of the five sets of HBTs used to form the graph in FIG. 8 were plotted in FIG. 11. Note that the $\Delta V_{be}$ for the members of a set span a range of $\Delta V_{be}$ for that set to which a straight line can be fitted. These lines are then used to determin (interpolate) the $\Delta V_{be}$ values for HBTs that could be grown using the same indium source gas flow rate of a particular set but with carbon source gas flow rates that are different from the other members of the set.

Figure 12:
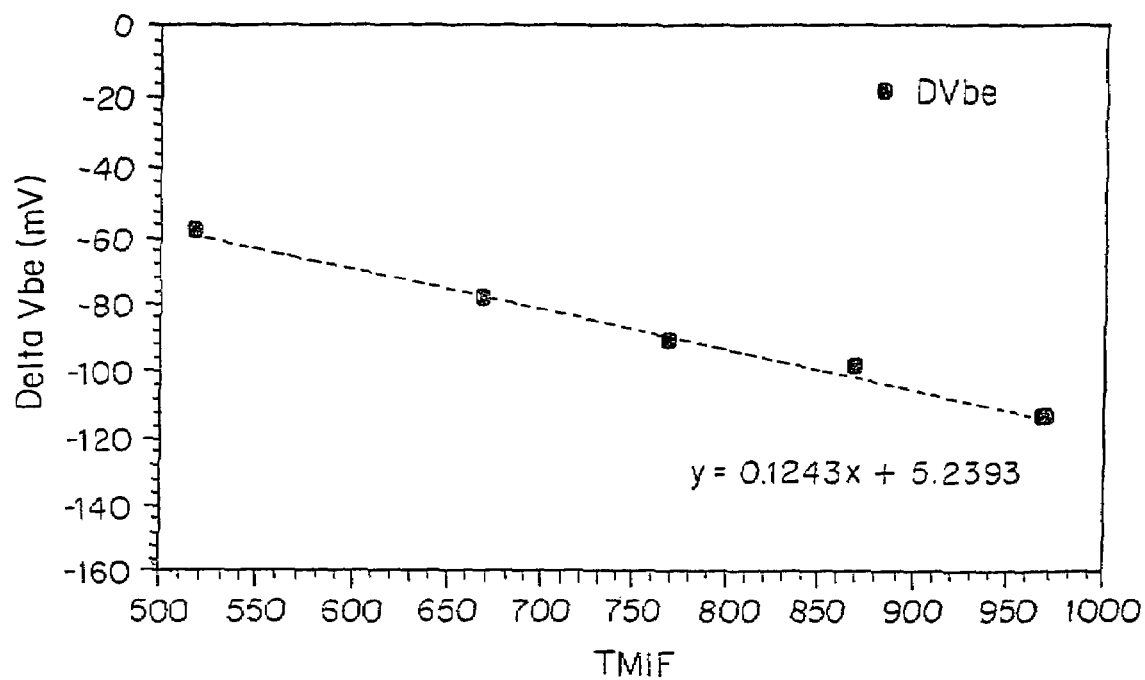
FIG. 12 is a graph of the $\Delta V_{be}$ versus TMIF.

The $\Delta V_{be}$ for a constant doping*mobility product varies linearly as a function of indium source gas flow rate, as can be seen when the interpolated $\Delta V_{be}$ for a constant doping*mobility product is plotted as a function of indium source gas flow rate. FIG. 12 shows this plot for the five sets used in FIG. 11.

Figure 9:
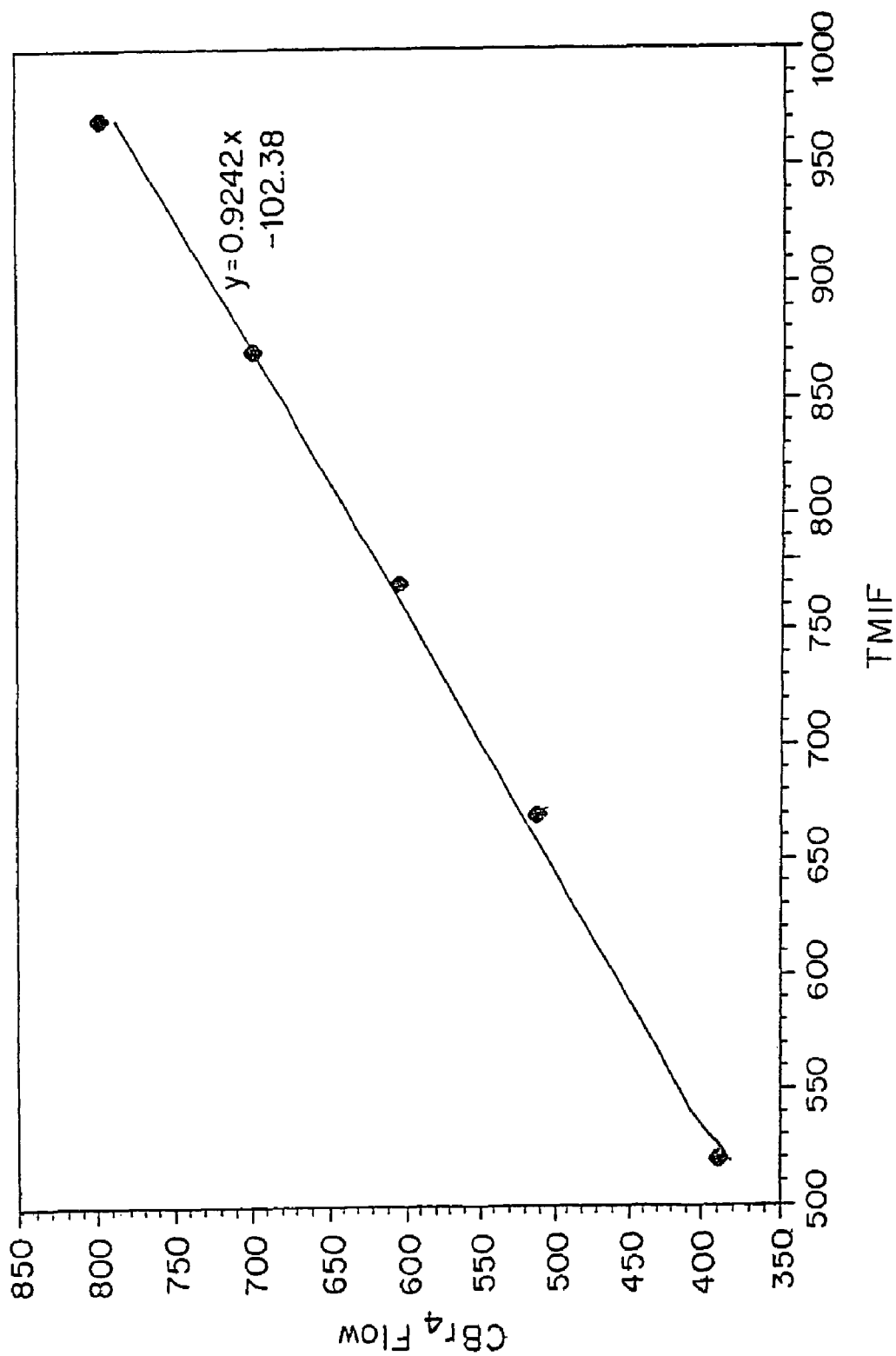
FIG. 9 is a graph of the TMIF versus the carbon tetrabromide flow rate needed to obtain a constant doping*mobility product while growing a carbon doped compositionally graded GaInAsN base layers.

The graph shown in FIG. 12 is used to determine the indium source gas flow needed to obtain the desired $\Delta V_{be}$ at the base-emitter and base/collector junctions. Once the indium source gas flow is determined, FIG. 9 is used to determine the carbon source gas flow needed at that indium source gas flow to obtain the desired dopant*mobility product. The same procedure is followed to determine the desired indium source gas flow and carbon source gas flow at the base-collector junction to maintain the desired constant dopant*mobility product in the compositionally graded GaInAs or GaInAsN layer. The indium source gas flow and carbon source gas flow are varied linearly relative to the gallium and arsenic levels when the base layer is grown from the base-collector junction to the base-emitter junction to the values determined for these source gases at these junctions to obtain a linearly graded base layer having a desired band gap grade.

EXAMPLE 2

All of the GaAs devices used in the following discussion were MOCVD-grown, carbon-doped base layers in which the dopant concentration varied from about $3.0 \times 10^{19}$ cm$^{-3}$ to about $5.0 \times 10^{19}$ cm$^{-3}$ and a thickness which varied from about 500 Å to about 1500 Å, resulting in a base sheet resistivity ($R_{sb}$) of between 100 W/□ and 650 W/□. Large area devices (L=75 mm×75 mm) were fabricated using a simple wet-etching process and tested in the common base configuration. Relatively small amounts of indium (x~1% to 6%) and nitrogen (y~0.3%) were added incrementally to form two separate sets of InGaP/GaInAsN DHBTs. For each set, growth was optimized to maintain relatively high, uniform carbon dopant levels (>2.5×10$^{19}$ cm$^{-3}$), good mobility (~85 cm$^2$/V–s), and high dc current gain (>60 at $R_{sb}$~300 W/square). The structure of a DHBT used in the following experiments having a compositionally graded GaInAsN base layer is shown in FIG. 13. Alternative structures for DHBTs having compositionally garded base layers is shown in FIGS. 7b and 7c. The structure of a DHBT having a constant composition GaInAsN base layer used in the following experiments for comparison is shown in FIG. 14.

Figure 15:
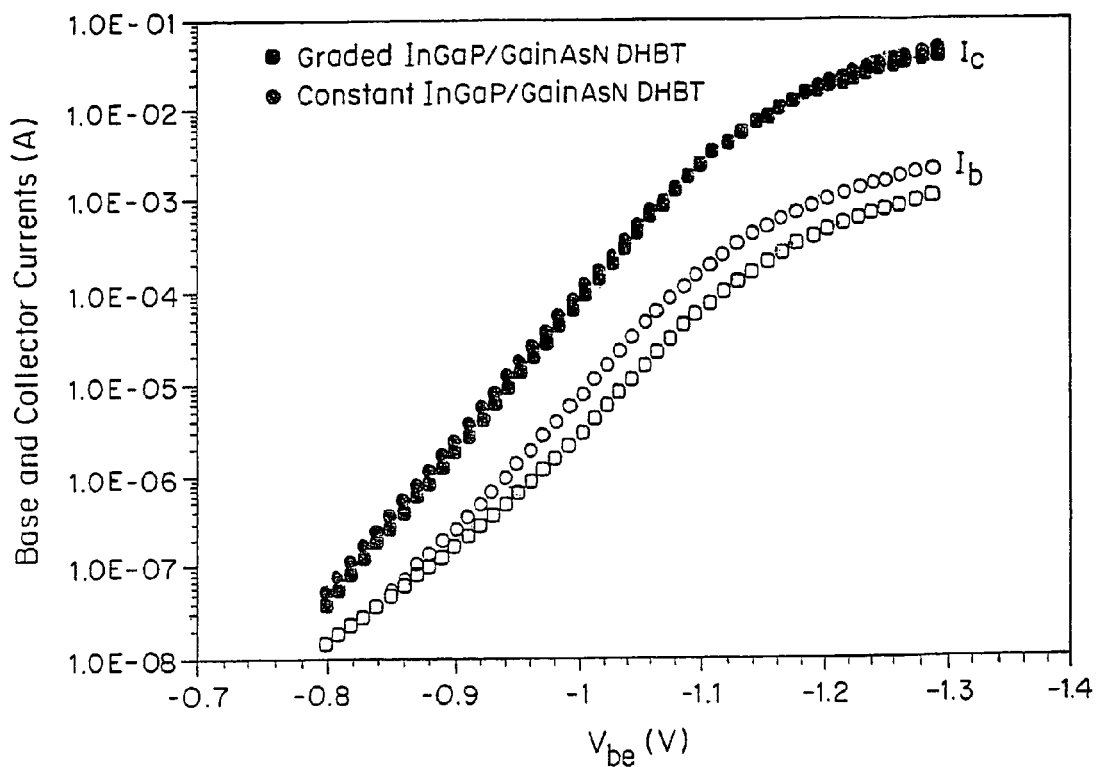
FIG. 15 is a Gummel plot comparing DHBTs having a constant composition GaInAsN base layer to DHBTs having a compositionally grade GaInAsN base layer.
Figure 16:
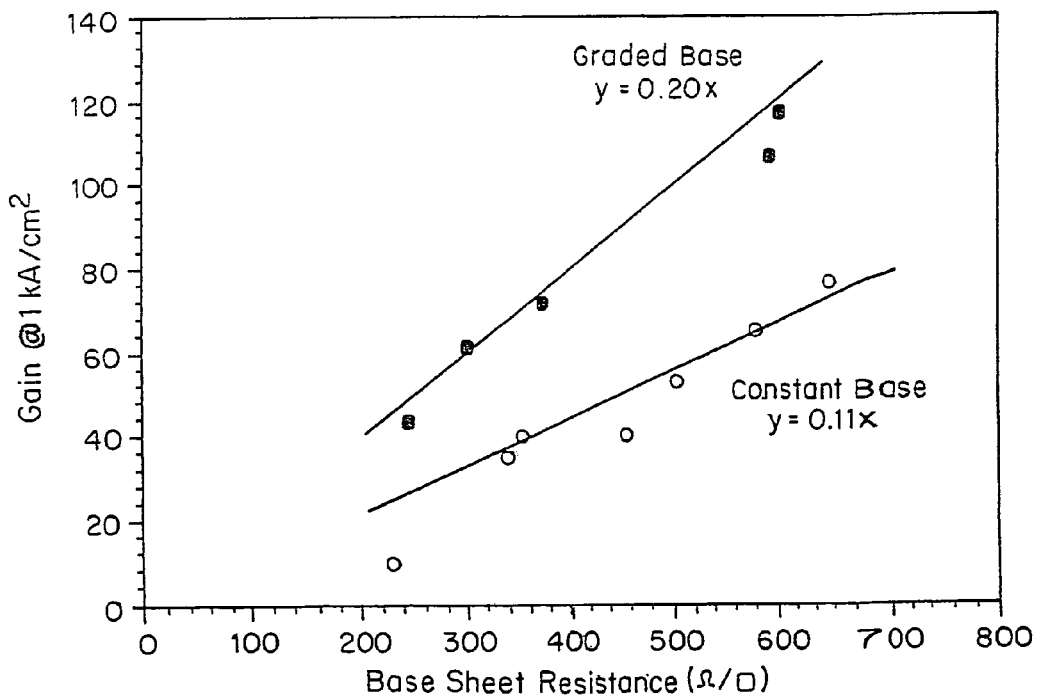
FIG. 16 is a graph of the DC current gain as a function of base sheet resistance for DHBTs having a constant composition GaInAsN base layer to DHBTs having a compositionally grade GaInAsN base layer.

FIG. 15 shows Gummel plots from a constant and a graded base DHBT with comparable turn-on voltages and base sheet resistance. The neutral base component of the base current is significantly lower in the graded base structure, which exhibits a peak dc current gain which can be over a factor of 2 higher than constant base structures. FIG. 16 compares dc current gain as a function of base sheet resistance from similar constant and graded DHBT structures with varying thicknesses. The increase in gain-to-base-sheet-resistance ratio is readily apparent. While the gain-to-base-sheet-resistance ratio of DHBTs depends on the growth conditions utilized and the specific details of the overall structure, a consistent 50% to 100% increase in dc current gain in DHBTs with a graded base layer over DHBTs with a constant base layer has been observed.

Figure 17:
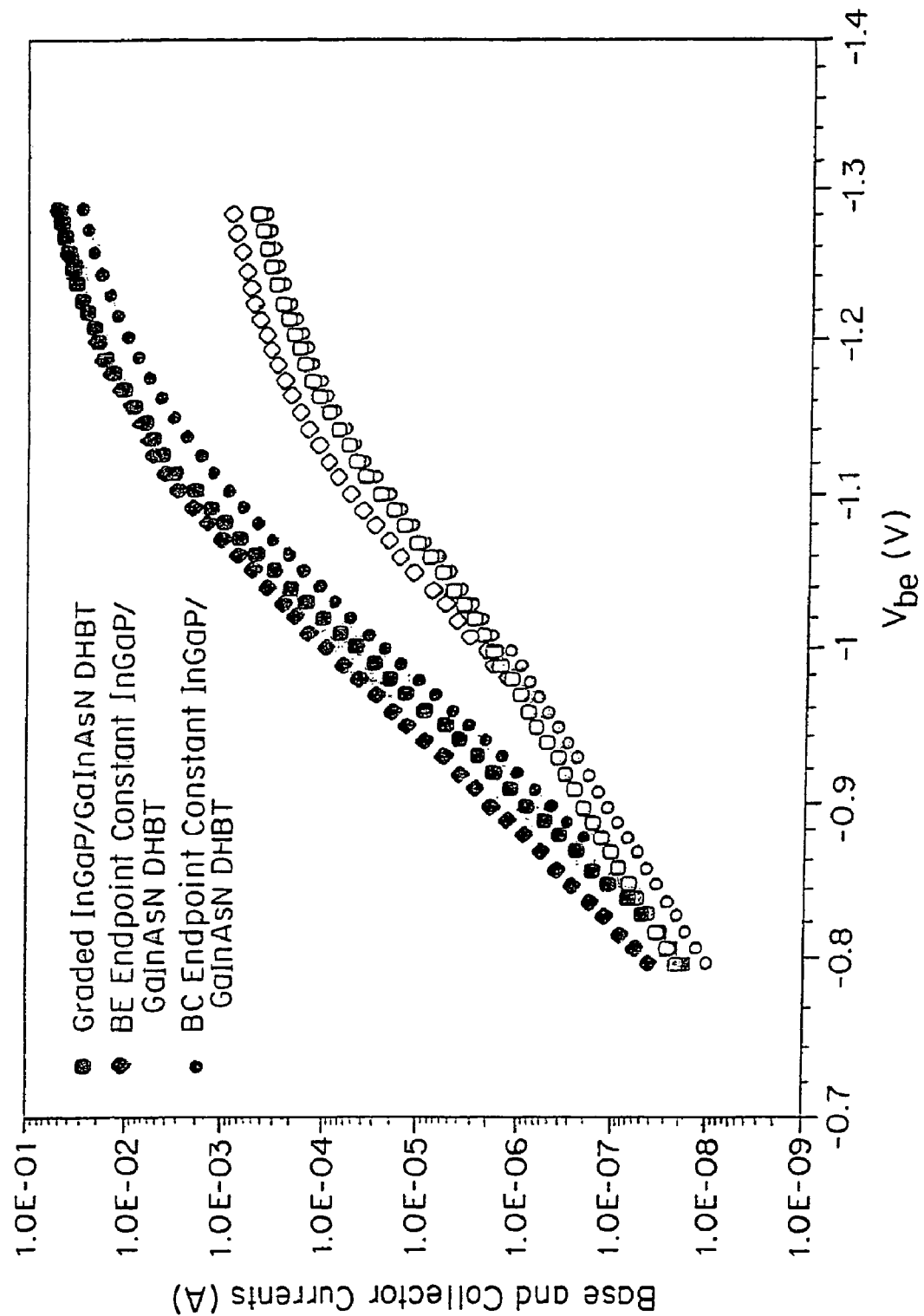
FIG. 17 is a Gummel plot comparing a DHBT having a compositionally grade GaInAsN base layer to two DHBTs having a constant composition GaInAsN base layer.
Figure 18:
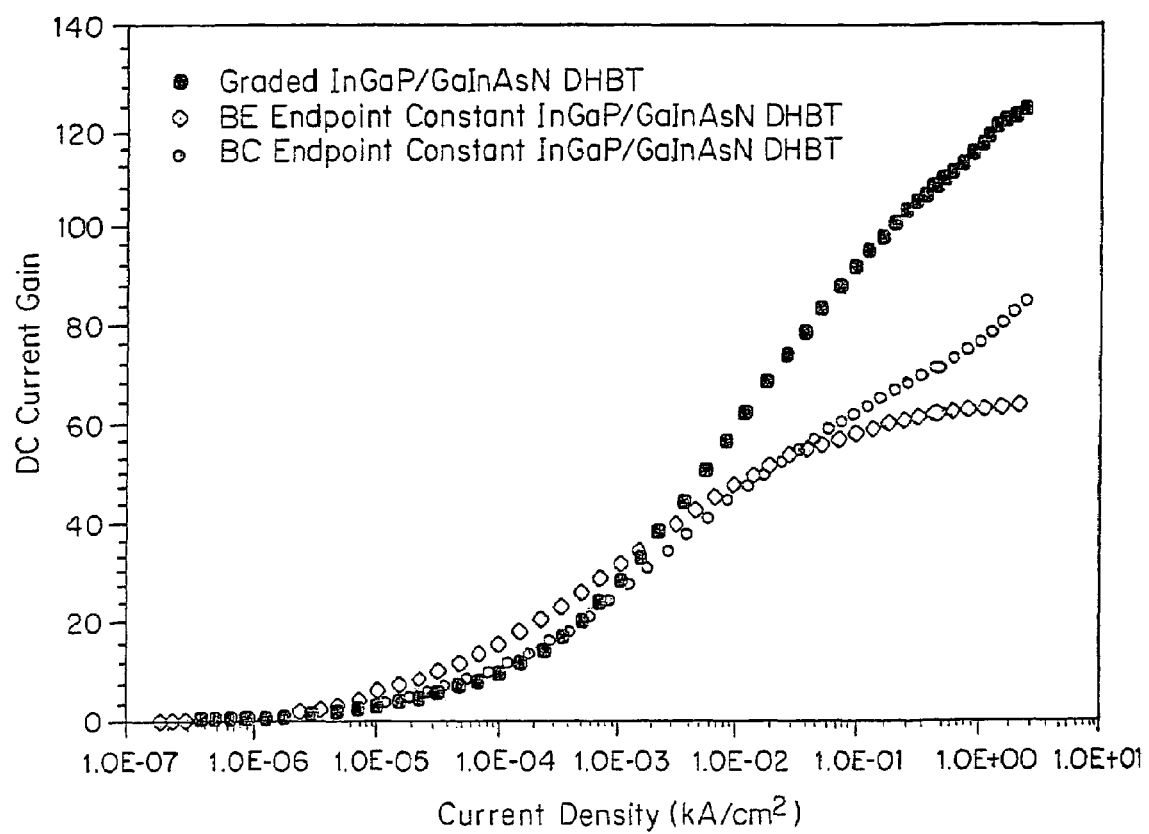
FIG. 18 is a graph of comparing DC current gain as a function of collector current density for a DHBT having a compositionally grade GaInAsN base layer to two DHBTs having a constant composition GaInAsN base layer.

FIGS. 17 and 18 compare the Gummel plots and gain curves from a graded base structure to two constant base structures. The base composition of the first constant base structure corresponding to the composition of base layer of the graded base at base-emitter junction. The base composition of the second constant base structure corresponding to the composition of base layer of the graded base at base-emitter junction. The turn-on voltage of the graded base structure is intermediate between the tow endpoint structures, but is weighted towards the base-emitter endpoint. The dc current gain of the graded bas structure is between 50% and 95% higher than the endpoint structures, indicating most of the increase in dc current gain results from an increased electron velocity.

Figure 19:
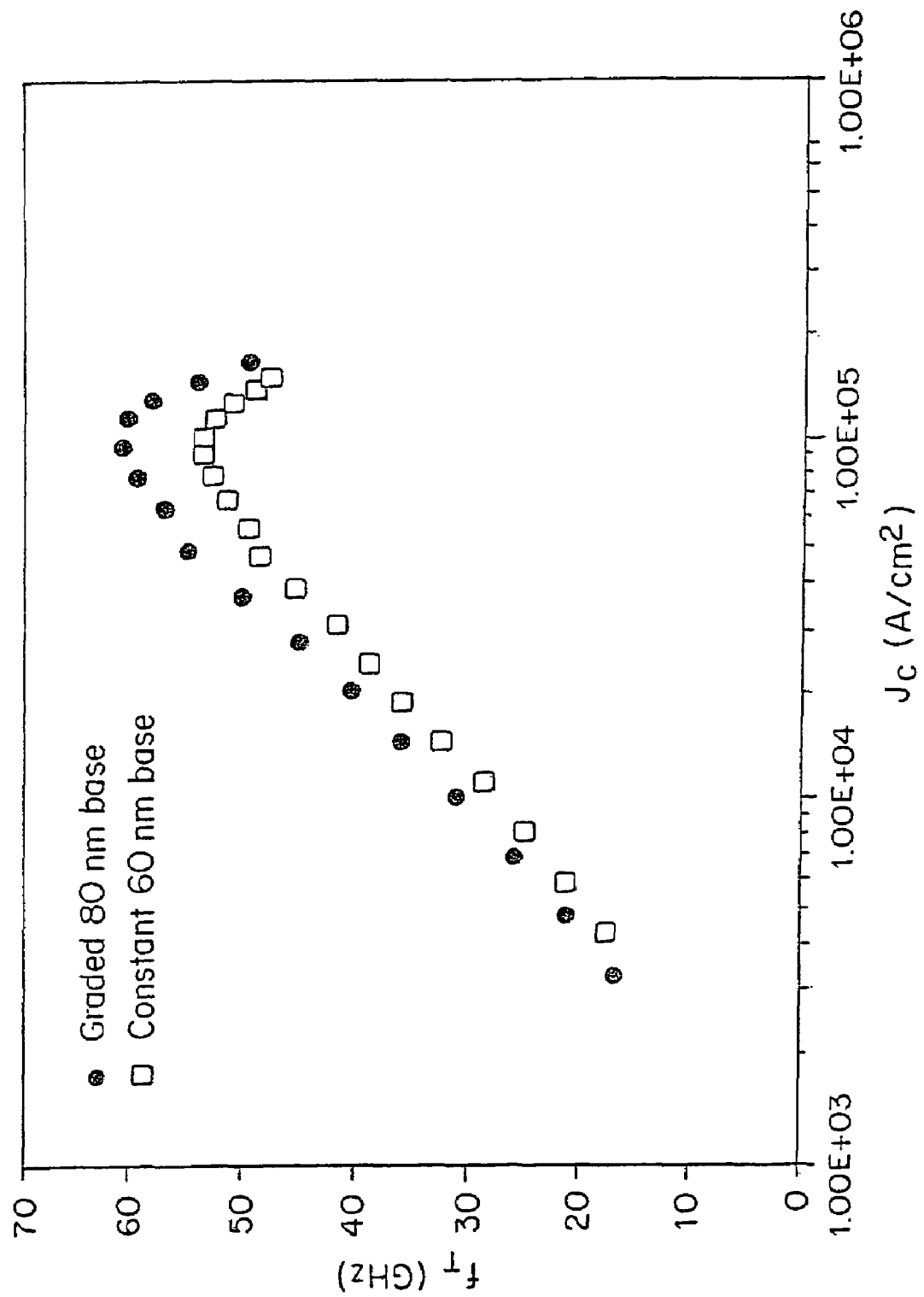
FIG. 19 is a graph comparing the extrapolated current gain cutoff frequency as a function of collector current density of DHBTs having a constant composition GaInAsN base layer to DHBTs having a compositionally grade GaInAsN base layer.
Figure 20:
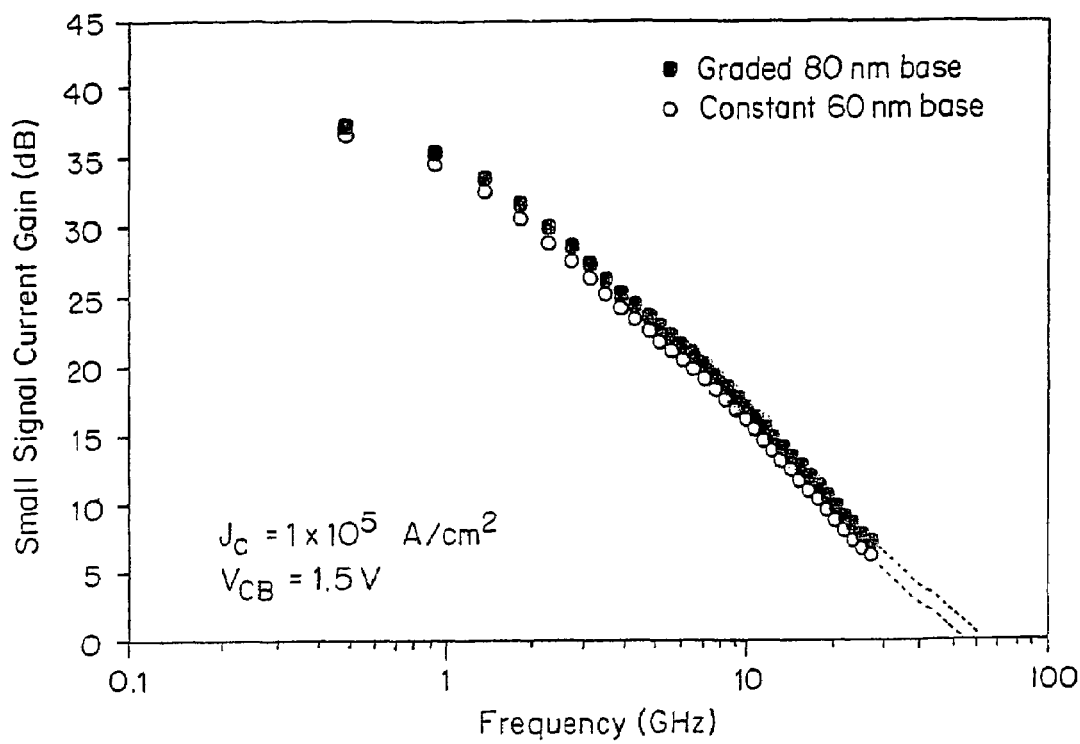
FIG. 20 is a graph comparing the small signal current gain as a function of frequency of DHBTs having a constant composition GaInAsN base layer to DHBTs having a compositionally grade GaInAsN base layer.

On-wafer FF testing was performed using an HP8510C parametric analyzer on 2 finger, 4 µm×4 µm emitter area devices. Pad parasitic were de-embedded using open and short structures, and the current gain cutoff frequency ($f_t$) was extrapolated using a −20 dB/dicade slope of the small signal current gain (H21). FIG. 19 summarizes the $f_t$ dependence with collector current density ($J_c$) on both structures. FIG. 20 illustrates the small signal gain versus frequency at one particular bias point. As $J_c$ increases and the base transit time ($t_b$) begins to play a limiting role in the total transit time, the $f_t$ of the graded base structure becomes notably larger than the constant composition structure, despite the greater base thickness of the graded base structure (constant base layer is 60 nm thick whereas graded base layer is 80 nm thick). The peak $f_t$ of the 60 nm constant composition GaInAsN base is 53 GHz, while the 80 nm compositionally graded GaInAsN base has a peak $f_t$ of 60 GHz. Thus, the current gain cutoff frequency is increased by 13%.

To better compare the RF results of DHBTs having a constant and a graded GaInAsN base layer to one another and to conventional GaAs HBTs, the $f_t$ values form FIG. 19 were plotted as a function of the zero-input-current breakdown voltage ($BV_{ceo}$) that can be applied to the transistor.

Figure 21:
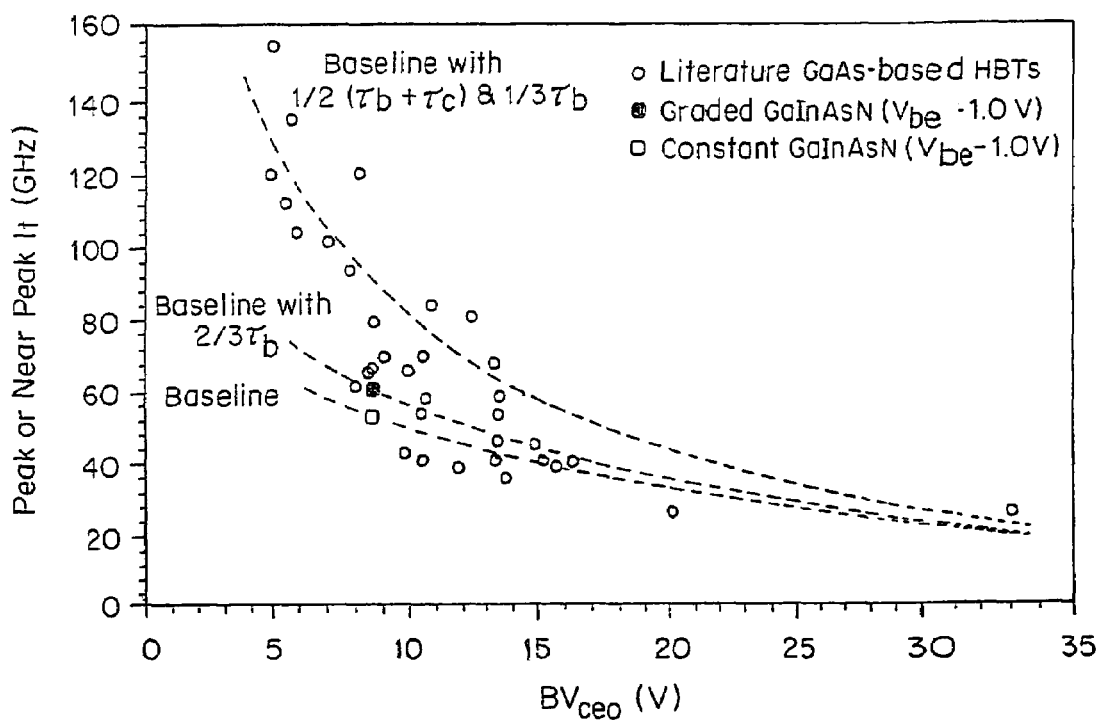
FIG. 21 is a graph of the peak $f_t$ as a function of $BV_{ceo}$ of constant composition GaInAsN base layer and DHBTs having a compositionally grade GaInAsN base layer to conventional HBTs having a GaAs base layer.

This plot was compared to the peak or near peak $f_t$ values of conventional GaAs HBTs quoted in the literature. A fairly wide distribution in the $f_t$ values of the conventional GaAs HBTs was expected, as this data was compiled from many groups using different epitaxial structures, device sizes, and test conditions, and is only meant to give a sense of current industry standards. The $BV_{ceo}$ most often had to be estimated from quoted collector thickness assuming the relations between the collector thickness ($X_c$), $BV_{cbo}$ and $BV_{ceo}$ shown in FIG. 21. Also shown in FIG. 21 are three simple calculations of the expected dependence of $f_t$ on $BV_{ceo}$ assuming the transit time through the space charge layer of collector ($\tau_{sclc}$) is simply related to $X_c$ via the electron saturation (drift) velocity ($v_s$). In the baseline calculation, the $\tau_b$ is assumed to be 1.115 ps, as expected from Monte-Carlo calculations for a 1000 Å GaAs base layer, and the sum of the remaining emitter and collector transit times ($\tau_e+\tau_c$) was taken as 0.95 ps.

Examination of FIG. 21 indicates that while the $f_t$ of the constant composition GaInAsN is not entirely outside the range expected for conventional GaAs-based HBTs, it is clearly on the low end of the distribution. The graded base structure is notably improve. The second calculation (baseline with $\tau_b$ reduced by ⅔) suggests the base transit time was decreased by approximately 50% relative to the constant composition structure. This indicate that a 2×increase in velocity of carriers was achieved in the graded base layer as compared to the constant composition base layer since a 2× increase in velocity combined with a 33% increase in base thickness is expected to lead to a reduction in $\tau_b$ of ½×⁴⁄₃=⅔. The third calculation (baseline with $\tau_b$ reduced by ⅓ and ($\tau_e+\tau_c$) by ½) approximates situations in which thin and/or graded base structures are employed along with improved device layout and size (to minimize $\tau_b$, $\tau_e$ and $\tau_c$).

Alternative Emitter and Collector Designs

Further improvements to HBT performance can be achieved by combining the low energy-gap base layers of the present invention with enhanced emitter and/or collector designs.

EXAMPLE 3

In order to improve the amplifier efficiency and thus lower the operating voltage and extend the battery lifetime, it is desirable to reduce the offset voltage ($V_{CE,sat}$) and the knee voltage ($V_k$). One method of lowering the offset voltage is to minimize the asymmetry in turn-on voltages of the base/emitter and base/collector diode pair. DHBTs having wide bandgap collectors have been shown to yield low $V_{CE,sat}$ values, but in practice this leads to a higher $V_k$ and reduces efficiencies because it is difficult to control the potential barrier at the base/collector heterojunction.

Figure 23:
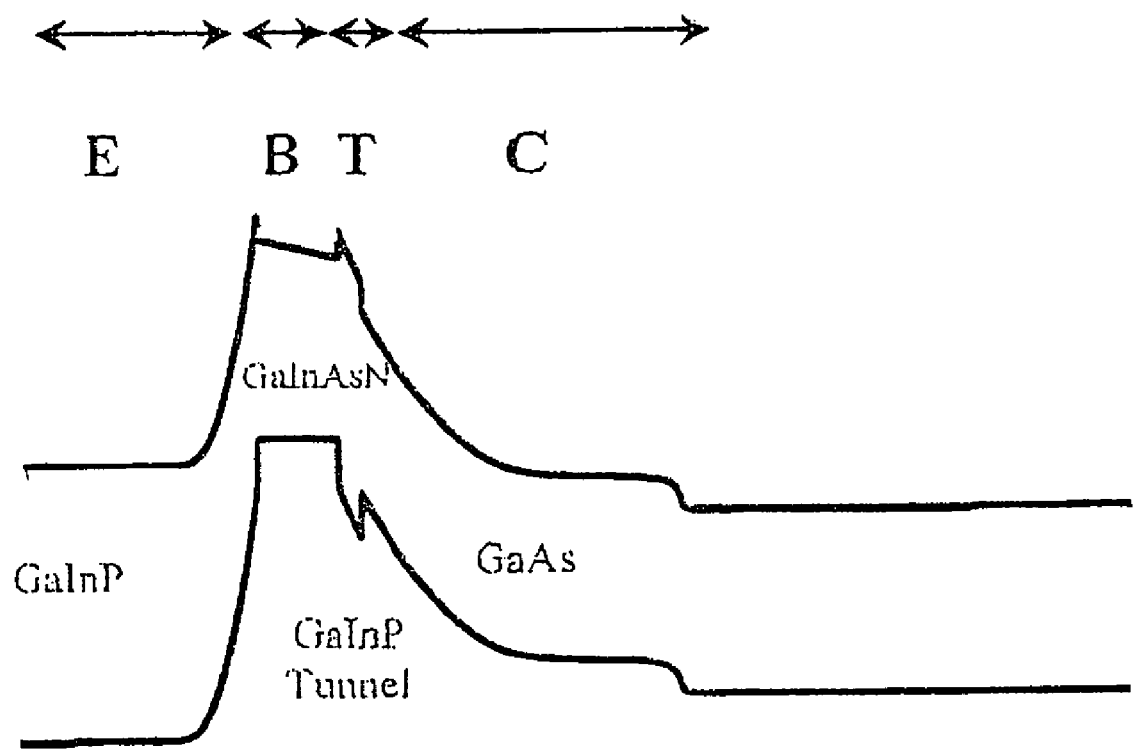
FIG. 23 is an energy bandgap diagram of the DHBT described in FIG. 22.
Figure 24:
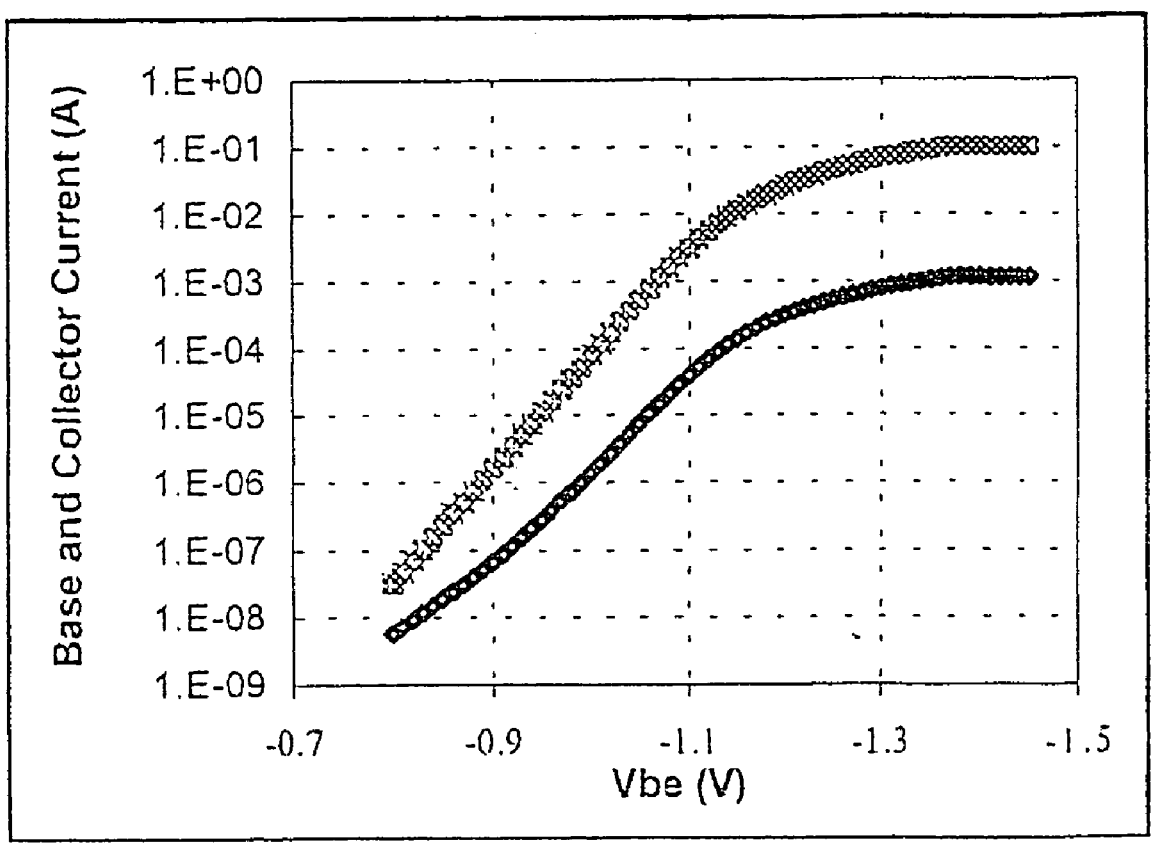
FIG. 24 is a Gummel plot of the DHBT described in FIG. 22.
Figure 25:
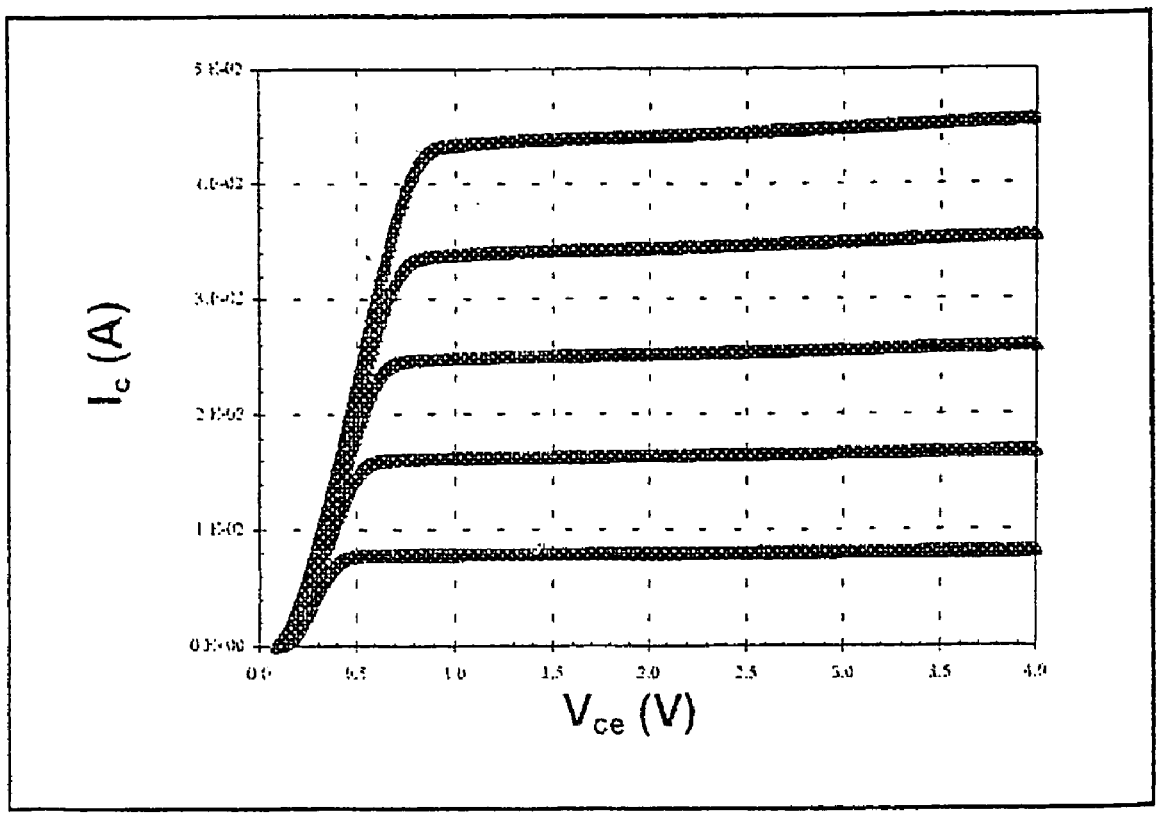
FIG. 25 shows the common emitter characteristics for the DHBT described in FIG. 22.

Insertion of a thin layer having a high bandgap (tunneling collector) allowed $V_{CE,sat}$ and $V_k$ to be simultaneously reduced improving the efficiency of the device. FIG. 22 shows a schematic diagram of a DHBT that has a graded GaInAsN base layer and a tunneling collector. The base layer was graded such that there is about a 40 meV bandgap energy difference between the emitter and the collector junctions. A 100 Å thick tunneling collector was fabricated between the base and the collector that was composed of a high band gap material, $In_{0.5}Ga_{0.5}P$. FIG. 23 shows a band-gap diagram of the DHBT of FIG. 22. The DHBTs were fabricated using a simple wet-etching process as large area devices (L=75 μm×75 μm) and tested in the common base and common emitter configurations. FIG. 24 shows a Gummel plot and FIG. 25 show common-emitter characteristics for the DHBT of FIG. 22. As can be seen from FIGS. 24 and 25, the device has a low offset voltage of about 0.12 V.

EQUIVALENTS

While this invention has been particularly shown and described with references to preferred embodiments thereof, it will be understood by those skilled in the art that various changes in form and details may be made therein without departing from the scope of the invention encompassed by the appended claims.

What is claimed is:

1. A heterojunction bipolar transistor, comprising:
  (a) an n-doped collector;
  (b) a base comprising a semiconductor material that contains antimony (Sb), and formed over the collector, wherein the average band gap of the base is at least about 10 meV less than the band gap of GaAs material, and wherein the base is doped with carbon at a concentration of about $1.5\times10^{19}$ cm$^{-3}$ to about $7.0\times10^{19}$ cm$^{-3}$; and
  (c) an n-doped emitter formed over the base,
wherein the collector is GaAs and the emitter is InGaP, AlInGaP, or AlGaAs and the transistor is a double heterojunction bipolar transistor.

2. The transistor of claim 1, wherein the average band gap of the base is between about 10 meV and about 600 meV less than the band gap of GaAs material.

3. The transistor of claim 2, wherein the average band gap of the base is at least about 80 meV less than the band gap of GaAs material.

4. The transistor of claim 3, wherein the average band gap of the base is at least about 180 meV less than the band gap of GaAs material.

5. The transistor of claim 1, wherein the base comprises at least one of GaAsSb, GaAsSbN, and InGaAsSbN.

6. The transistor of claim 1, wherein the doping concentration of the base varies from a first side of the base proximate to the collector to a second side of the base proximate to the emitter.

7. A heterojunction bipolar transistor, comprising:
  (a) an n-doped collector;
  (b) a base comprising InNAs and formed over the collector, wherein the average band gap of the base is at least about 10 meV less than the band gap of GaAs material, and wherein the base is doped with carbon at a concentration of about $1.5\times10^{19}$ cm$^{-3}$ to about $7.0\times10^{19}$ cm$^{-3}$; and
  (c) an n-doped emitter formed over the base.

8. A heterojunction bipolar transistor, comprising:
  (a) an n-doped collector;
  (b) a base comprising a semiconductor material and formed over the collector, wherein the average band gap of the base is at least about 10 meV less than the band gap of GaAs material, and wherein the base is doped with carbon at a concentration of about $1.5\times10^{19}$ cm$^{-3}$ to about $7.0\times10^{19}$ cm$^{-3}$; and
  (c) an n-doped emitter formed over the base,
wherein the collector is GaAs and the emitter is InGaP, AlInGaP, or AlGaAs and the transistor is a double heterojunction bipolar transistor.

9. A heterojunction bipolar transistor, comprising:
  (a) an n-doped collector;
  (b) a base comprising a semiconductor material and formed over the collector, wherein the average band gap of the base is at least about 10 meV less than the band gap of GaAs material, and wherein the base is doped with carbon at a concentration of about $1.5 \times 10^{19}$ cm$^{-3}$ to about $7.0 \times 10^{19}$ cm$^{-3}$; and (c) an n-doped emitter formed over the base, wherein the base includes a layer of the formula $Ga_{1-x}In_xAs_{1-y}N_y$, x being about equal to 3y, and x and y being each, independently, about $1.0 \times 10^{-4}$ to about $2.0 \times 10^{-1}$, and wherein x has a value in a range of about 0.2 to about 0.02 at the collector and is graded to a value in a range of about 0.1 to about zero at the emitter, provided that x is larger at the collector than at the emitter.

10. The transistor of claim 9, wherein x is about 0.06 at the collector and about 0.01 at the emitter.

11. A heterojunction bipolar transistor, comprising:
(a) an n-doped collector;
(b) a base comprising a semiconductor material and formed over the collector, wherein the average band gap of the base is at least about 10 meV less than the band gap of GaAs material, and wherein the base is doped with carbon at a concentration of about $1.5 \times 10^{19}$ cm$^{-3}$ to about $7.0 \times 10^{19}$ cm$^{-3}$;
(c) an n-doped emitter formed over the base; and
(d) a tunnel layer between the base and the collector, the tunnel layer comprising a semiconductor material that is different from the materials forming the base and the collector.

12. The transistor of claim 11, wherein the tunnel layer has a band gap that is larger than the band gap of the collector.

13. The transistor of claim 11, wherein the collector layer comprises GaAs, and the tunnel layer comprises InGaP.

14. The transistor of claim 11, wherein the thickness of the tunnel layer is substantially less than the thickness of the base and of the collector.

15. The transistor of claim 14, wherein the tunnel layer has a thickness of about 100 Å or less.

16. The transistor of claim 11, wherein the thickness and composition of the tunnel layer are selected to promote reduction in the offset and knee-voltages of the transistor.

* * * * *